US009887205B2

(12) United States Patent
Fox et al.

(10) Patent No.: US 9,887,205 B2
(45) Date of Patent: Feb. 6, 2018

(54) FERROELECTRIC MECHANICAL MEMORY AND METHOD

(71) Applicant: U.S. Army Research Laboratory, Adelphi, MD (US)

(72) Inventors: Glen R Fox, Colorado Springs, CO (US); Jeffrey S. Pulskamp, Fulton, MD (US); Ronald G. Polcawich, Derwood, MD (US)

(73) Assignee: The United States of America as represented by the Secretary of the Army, Washington, DC (US)

(*) Notice: Subject to any disclaimer, the term of this patent is extended or adjusted under 35 U.S.C. 154(b) by 0 days.

(21) Appl. No.: 15/200,816

(22) Filed: Jul. 1, 2016

(65) Prior Publication Data

US 2016/0315090 A1    Oct. 27, 2016

Related U.S. Application Data

(62) Division of application No. 14/645,711, filed on Mar. 12, 2015, now Pat. No. 9,385,306.

(Continued)

(51) Int. Cl.
*H01L 21/00* (2006.01)
*H01L 27/11507* (2017.01)
(Continued)

(52) U.S. Cl.
CPC ........ *H01L 27/11507* (2013.01); *G11C 11/22* (2013.01); *G11C 11/221* (2013.01);
(Continued)

(58) Field of Classification Search
CPC ... G11C 11/22; G11C 11/221; G11C 11/2273; G11C 11/50; G11C 23/00;
(Continued)

(56) References Cited

U.S. PATENT DOCUMENTS

| 7,567,018 B2* | 7/2009 | Kawakubo | ............ B81B 3/0021 |
| | | | 200/181 |
| 2003/0132477 A1* | 7/2003 | Higuchi | .................. C30B 23/02 |
| | | | 257/310 |

(Continued)

*Primary Examiner* — Mohammed Shamsuzzaman
(74) *Attorney, Agent, or Firm* — Lawrence E. Anderson

(57) ABSTRACT

A method of making a memory device comprising a base; a capacitor comprising a ferroelectric layer and at least two electrically conductive layers, the ferroelectric layer being located between the at least two electrically conductive layers; each of the at least two conductive layers being operatively connected to a current source; a cantilever attached to the base at first end and movable at a second end, the ferroelectric capacitor being mounted to the cantilever such that the second end of the cantilever moves a predetermined displacement upon application of a current to the ferroelectric layer which induces deformation of the ferroelectric layer thereby causing displacement of the cantilever which is operatively associated with a contact so that an electrical connection is enabled with the contact upon the predetermined displacement of the cantilever. The presence or absence of a connection forms two states of a memory cell.

17 Claims, 30 Drawing Sheets

Related U.S. Application Data

(60) Provisional application No. 61/953,403, filed on Mar. 14, 2014.

(51) Int. Cl.
  *H01L 43/08* (2006.01)
  *H01L 43/02* (2006.01)
  *H01L 43/10* (2006.01)
  *H01L 43/12* (2006.01)
  *G11C 11/22* (2006.01)
  *G11C 11/50* (2006.01)
  *G11C 23/00* (2006.01)

(52) U.S. Cl.
  CPC .......... *G11C 11/2273* (2013.01); *G11C 11/50* (2013.01); *G11C 23/00* (2013.01); *H01L 43/02* (2013.01); *H01L 43/08* (2013.01); *H01L 43/10* (2013.01); *H01L 43/12* (2013.01)

(58) Field of Classification Search
  CPC ... H01L 27/11507; H01L 43/02; H01L 43/08; H01L 43/10; H01L 43/12
  USPC .................... 257/421, 310; 347/22; 360/294; 310/328; 438/3
  See application file for complete search history.

(56) References Cited

U.S. PATENT DOCUMENTS

| | | | | |
|---|---|---|---|---|
| 2004/0155559 A1* | 8/2004 | Ifuku | .................... | H01L 41/094 310/328 |
| 2006/0098059 A1* | 5/2006 | Ohguro | ................. | B81B 3/0018 347/72 |
| 2006/0285255 A1* | 12/2006 | Kawakubo | ............ | B81B 3/0021 360/294 |
| 2007/0041233 A1* | 2/2007 | Roelofs | ................... | G11C 11/22 365/145 |
| 2008/0094149 A1* | 4/2008 | Brobston | ................. | H03H 7/40 333/17.3 |
| 2010/0208573 A1* | 8/2010 | Adams | ................... | B82Y 10/00 369/126 |

\* cited by examiner

FIG. 1 – Ideal Displacement vs. Voltage for Virgin ferroelectric Switch (Displacement origin relative to virgin state)

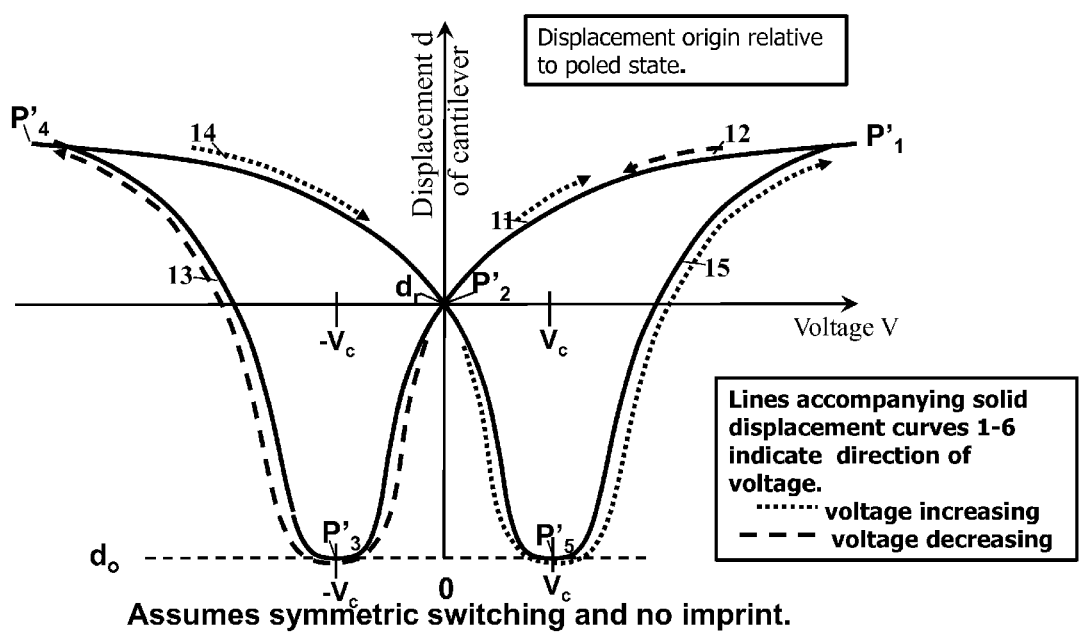
FIG. 3 – Ideal Displacement vs. Voltage for Poled ferroelectric Switch

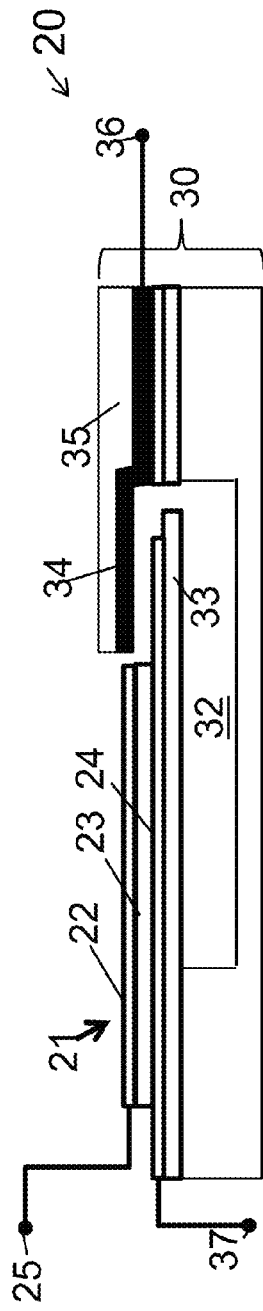

Fig. 4A Single-Switch/Single Capacitor Normally-Open Cell

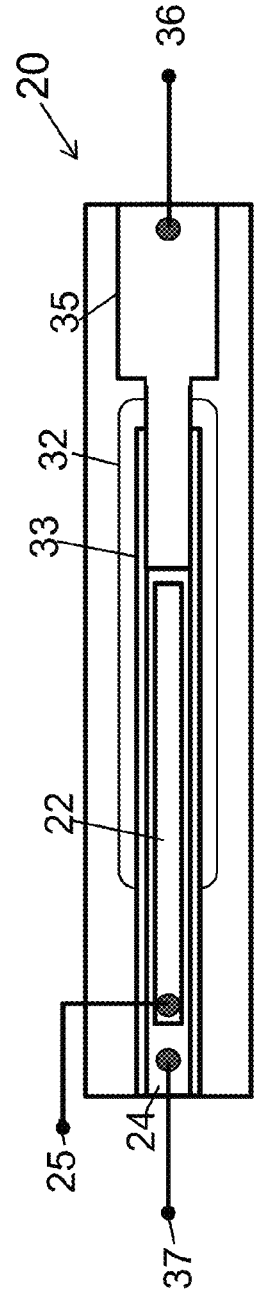

Fig. 4B Single-Switch/Single Capacitor Normally-Open Cell

When a positive voltage pulse in excess of $V_c$ is applied to contact/terminal-37, and contact/terminal-25 and contact/terminal 36 are held at ground, the ferroelectric layer 23 and thus, the capacitor subassembly, is poled up (positive) and the cantilever subassembly (including resilient layer 33 and conductive layer 24) displaces upward (positive) resulting in the write of a 1-state. Reversing the write pulse polarity on contact/terminal-37 such that a negative voltage is applied between contacts or terminals 25 and 37 results in the write of a 0-state.

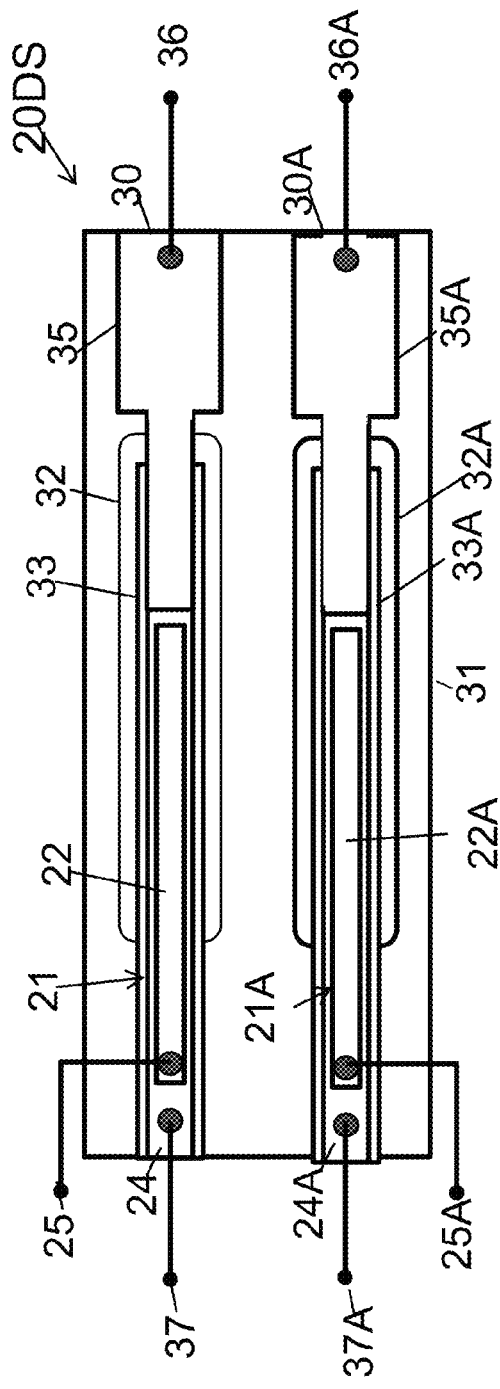
Fig. 4C Dual-Switch/Dual Capacitor Normally-Open Cell

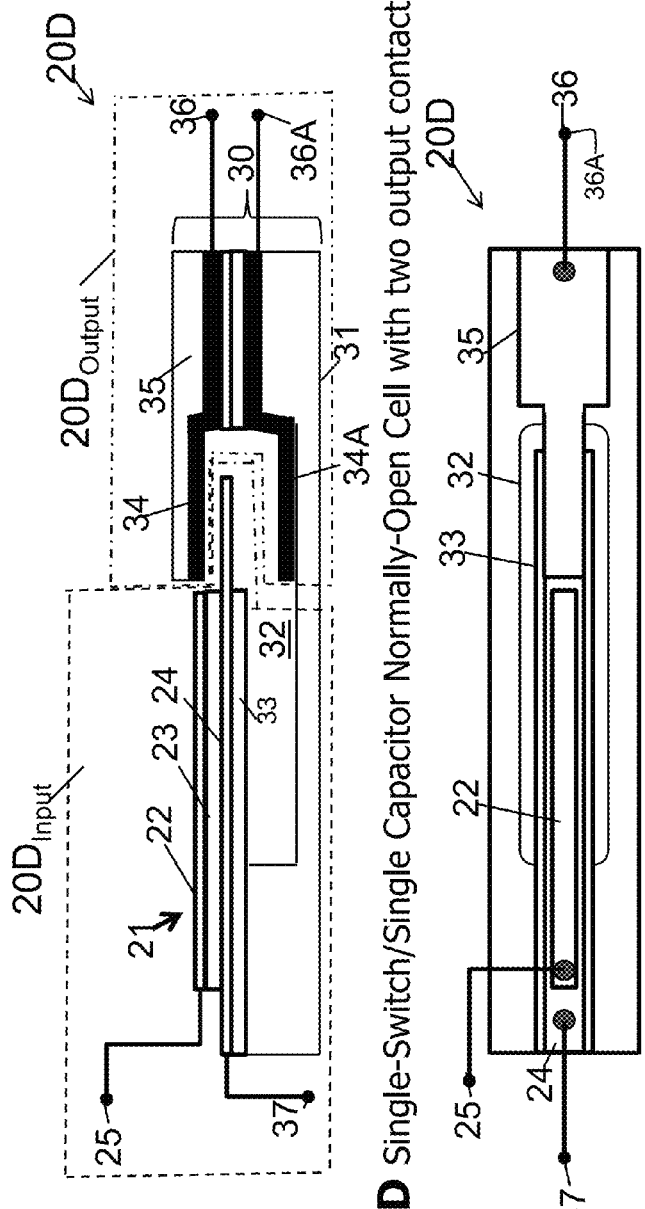

Fig. 4D Single-Switch/Single Capacitor Normally-Open Cell with two output contacts.

Fig. 4E Single-Switch/Single Capacitor Normally-Open Cell two output contacts.

When a positive voltage pulse in excess of $V_c$ (preferably resulting in greater than 90% saturation of the ferroelectric domain switching) is applied to contact/terminal-37, and contact/terminal-25 and contact/terminal-36 are held at ground, the ferroelectric layer 23 and thus, the capacitor subassembly, is poled up (positive) and the cantilever subassembly (including resilient layer 33 and conductive layer 24) displaces upward (positive) resulting in the write of a 1-state. Reversing the write pulse polarity on contact/terminal-37 such that a negative voltage is applied between contact/terminals 25 and 37 results in the write of a 0-state, i.e. the direction of displacement (derivative dd/dV) of the cantilever subassembly (including resilient layer 33 and conductive layer 24, ferroelectric layer 23 and conductive layer 22) will be negative.

FIG. 5A– Single Pulse Write Memory Operations and bipolar displacement memory states
Ideal Displacement vs. Voltage for Poled Switch Single Unipolar Pulse Write and Displacement diagram.

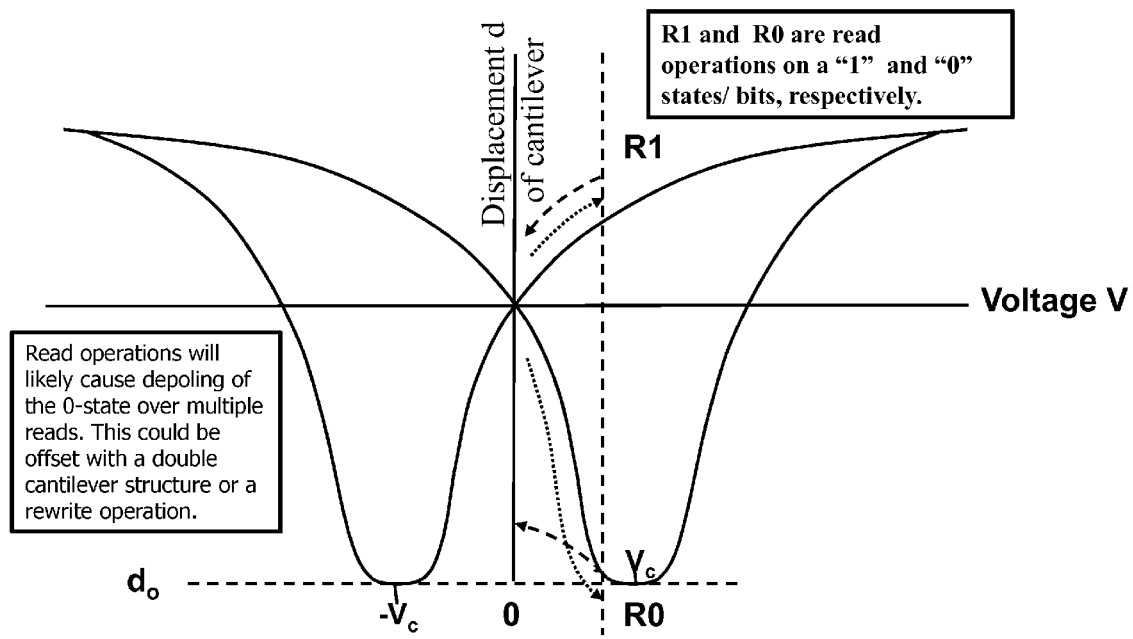
FIG. 6A – Single Unipolar Pulse Read Memory Operation

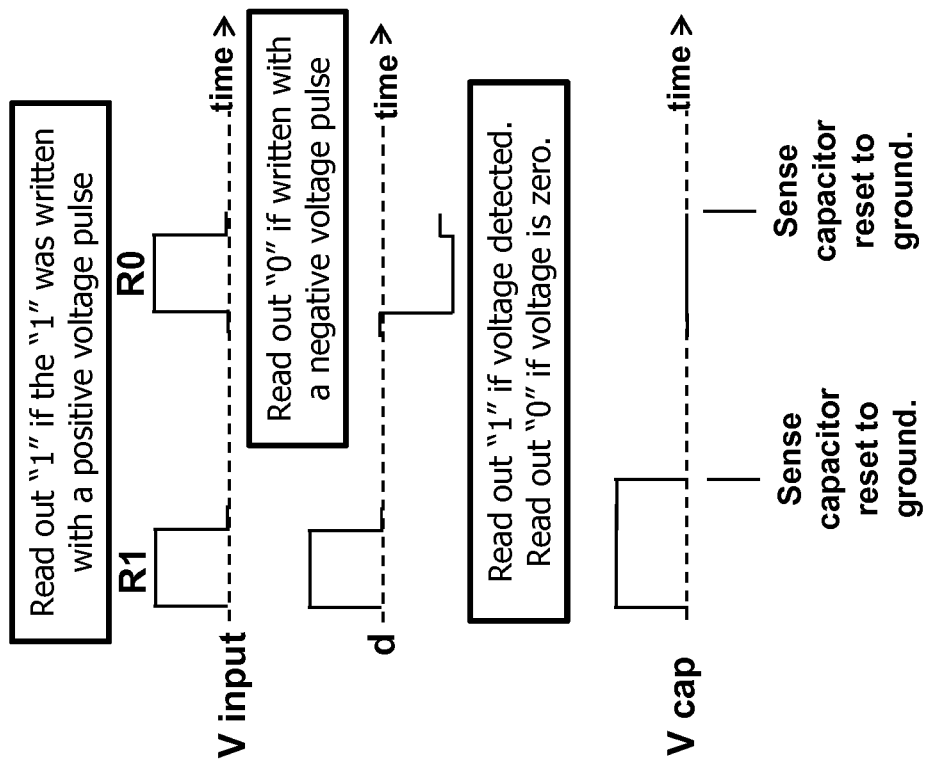
FIG. 6B – Single Unipolar Pulse Read Displacement and Sense Voltage Diagram

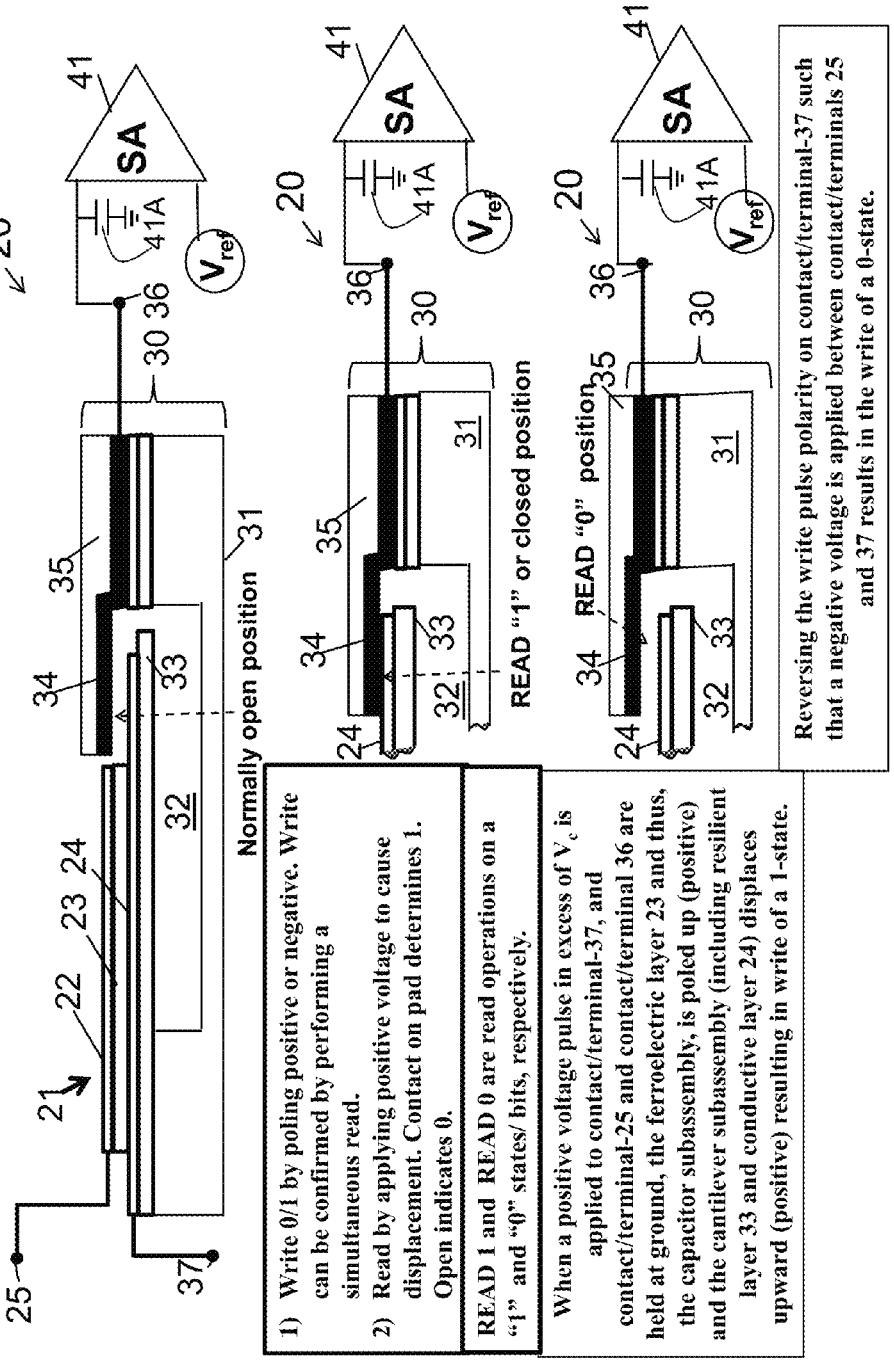

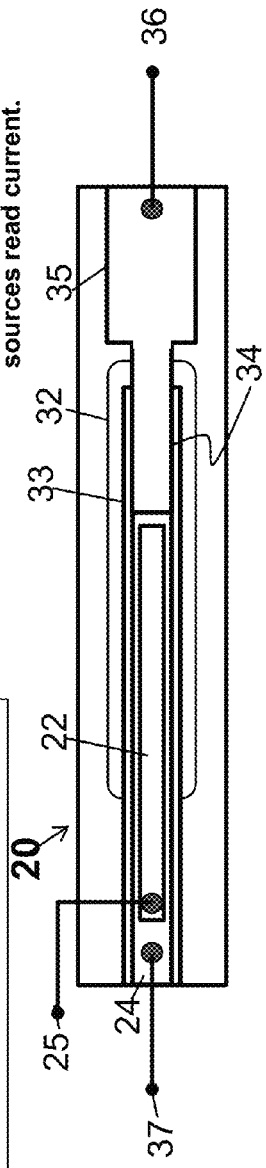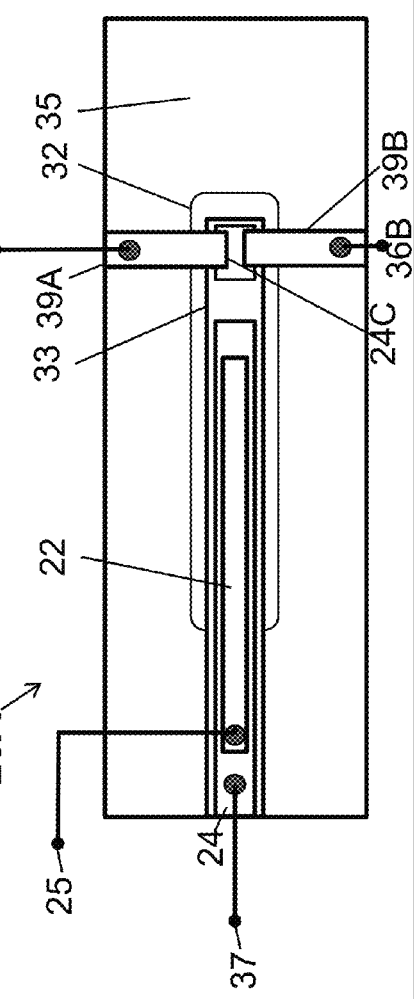

FIG. 7B

Voltage $V_c$ is applied to contact/terminal-25 and contact/terminal-25.

Cantilever drive electrode (24) sources read current.

FIG. 7C

Separate read line (39A and 39B) sources read current. Conductor 24A connects 39A and 39B when cantilever is in up position.

When a positive voltage pulse in excess of $V_c$ is applied to contact/terminal-37, and contact/terminal-25 and contact/terminal 36A,B are held at ground, the ferroelectric layer 23 and thus, the capacitor subassembly, is poled up (positive) and the cantilever subassembly (including resilient layer 33 and conductive layer 24) displaces upward (positive) resulting in write of a 1-state. Reversing the write pulse polarity on contact/terminal-37 such that a negative voltage is applied between contact/terminals 25 and 37 results in the write of a 0-state.

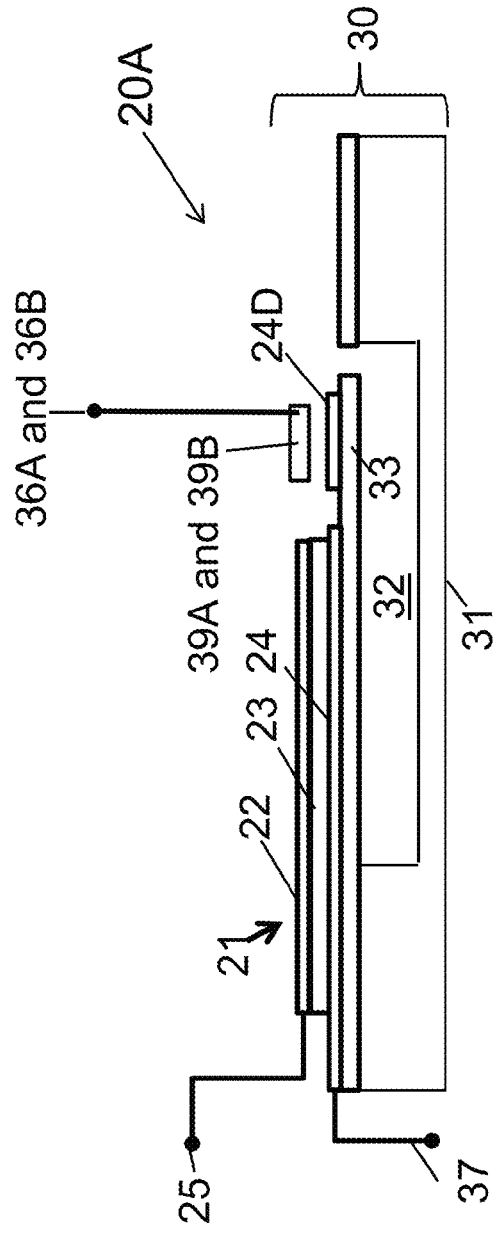

Fig. 7D Single-Switch/Single Capacitor, Normally-Open Cell, 4-terminal device.

When a positive voltage pulse in excess of $V_c$ is applied to contact/terminal-37, and contact/terminal-25 and contact/terminal 36A, B are held at ground, the ferroelectric layer 23 and thus, the capacitor subassembly, is poled up (positive) and the cantilever subassembly (including resilient layer 33 and conductive layer 24) displaces upward (positive) resulting in write of a 1-state. Reversing the write pulse polarity on contact/terminal-37 such that a negative voltage is applied between contact/terminals 25 and 37 results in the write of a 0-state.

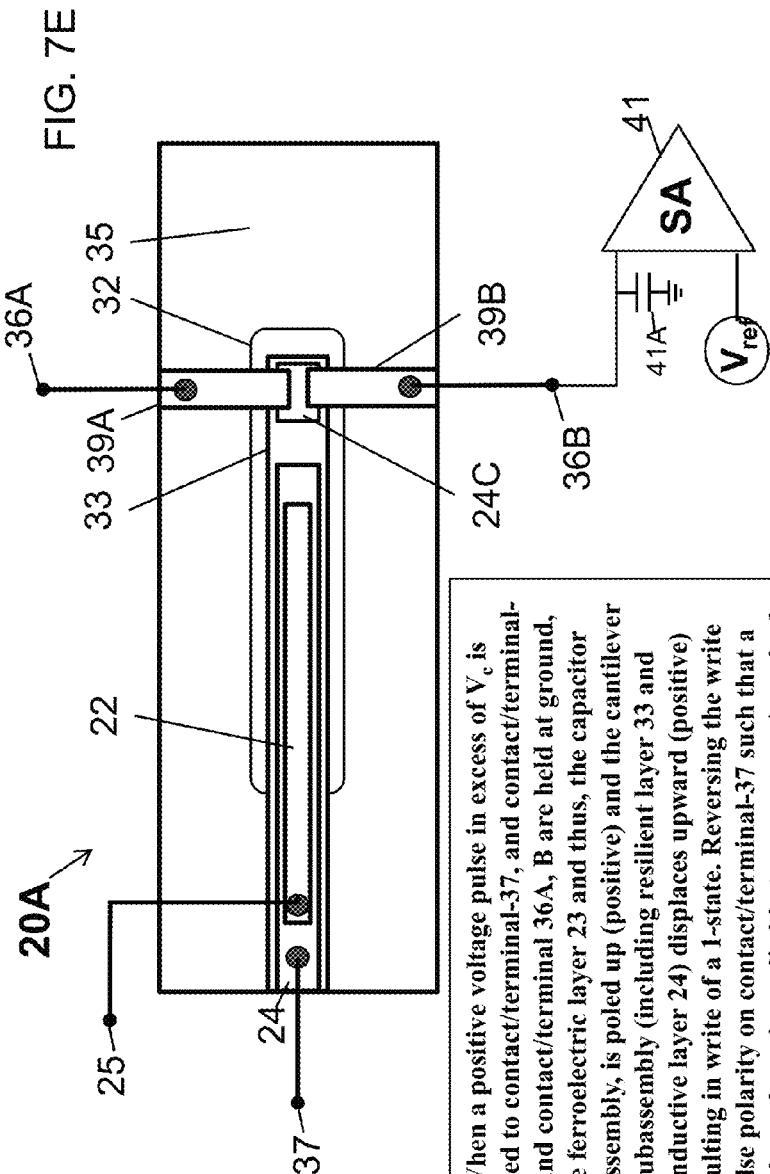

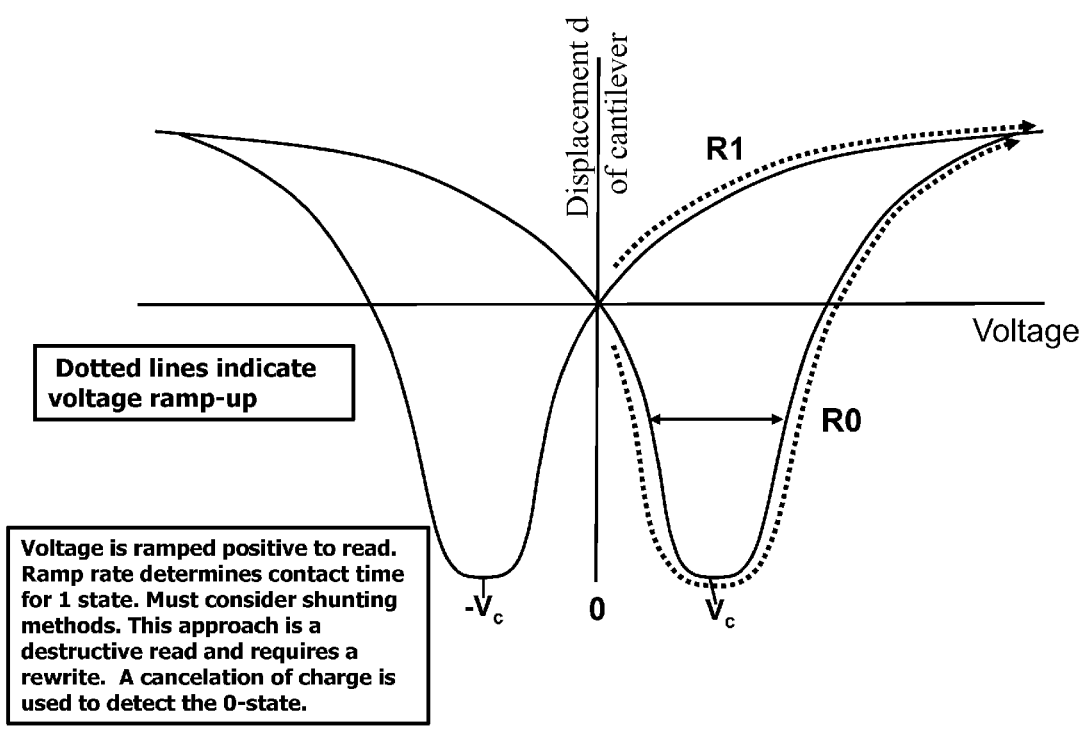
FIG. 8A — Single Saturated Unipolar Pulse Read

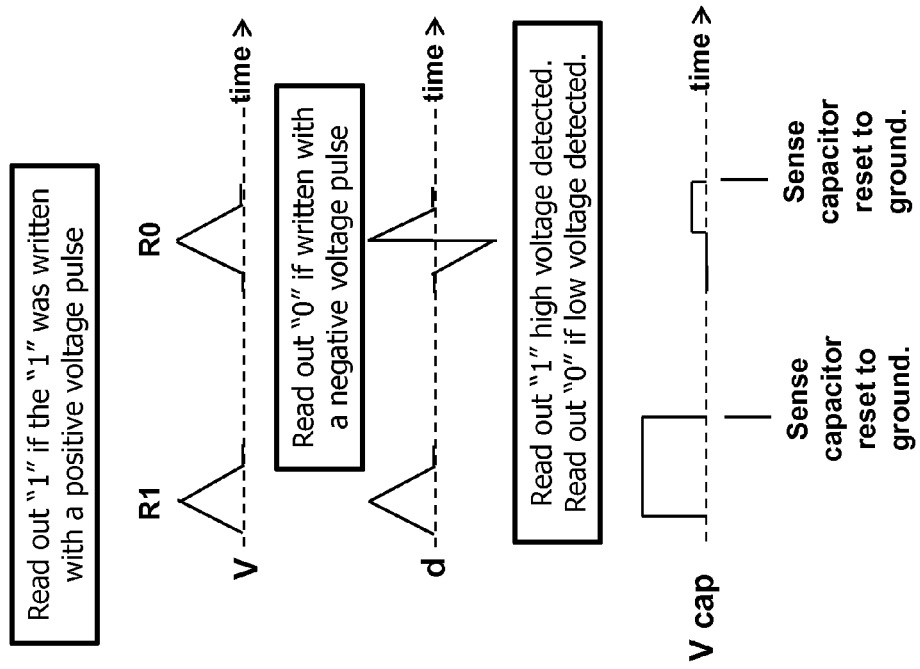
FIG. 8B – Single Unipolar Pulse Read Displacement and Sense Voltage diagram

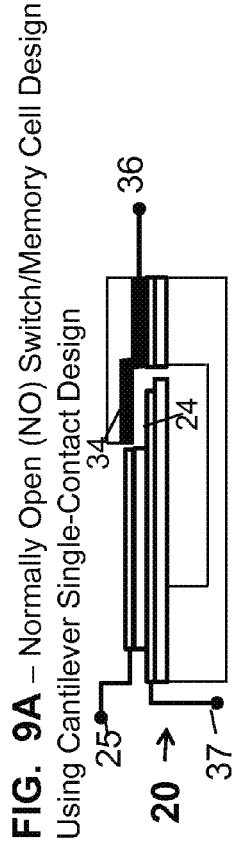

FIG. 9A – Normally Open (NO) Switch/Memory Cell Design Using Cantilever Single-Contact Design Write 1/0 by poling positive or negative. Read by applying positive voltage to cause cantilever displacement. Contact is 1-state. No contact is 0-state. Contact time is determined by voltage ramp applied to the ferroelectric capacitor.

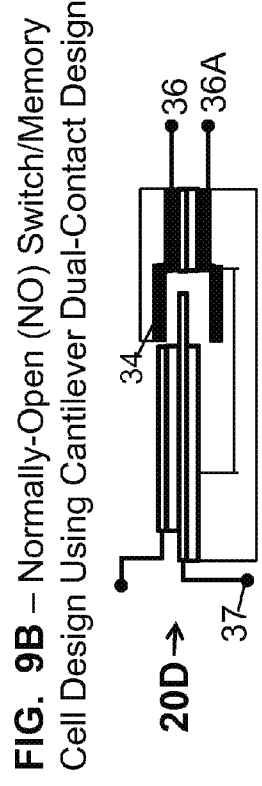

FIG. 9B – Normally-Open (NO) Switch/Memory Cell Design Using Cantilever Dual-Contact Design Write 1/0 by poling positive or negative. Read by applying positive voltage to cause cantilever displacement. Contact on top or bottom pad determines 1/0. Contact time is determined by voltage ramp applied to the ferroelectric capacitor.

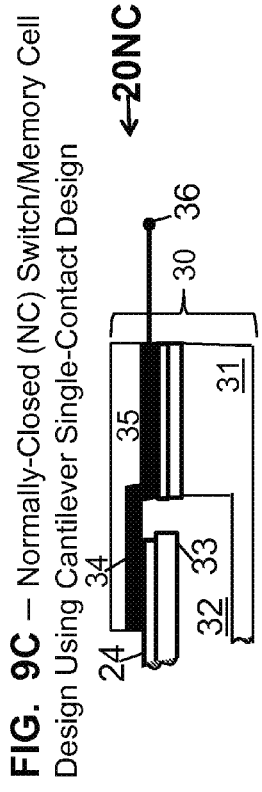

FIG. 9C – Normally-Closed (NC) Switch/Memory Cell Design Using Cantilever Single-Contact Design Write 1/0 by poling positive or negative. Read by applying positive voltage to cause cantilever displacement. Contact is 1-state. No contact is 0-state. Non-contact time is determined by voltage ramp applied to the ferroelectric capacitor.

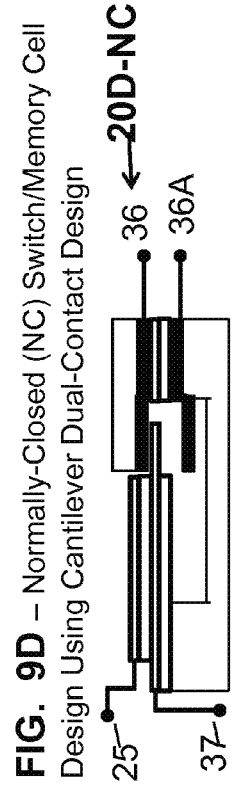

FIG. 9D – Normally-Closed (NC) Switch/Memory Cell Design Using Cantilever Dual-Contact Design Write 1/0 by poling positive or negative. Read by applying positive voltage to cause cantilever displacement. Contact on top or bottom pad determines 1/0. Non-contact time is determined by voltage ramp applied to the ferroelectric capacitor.

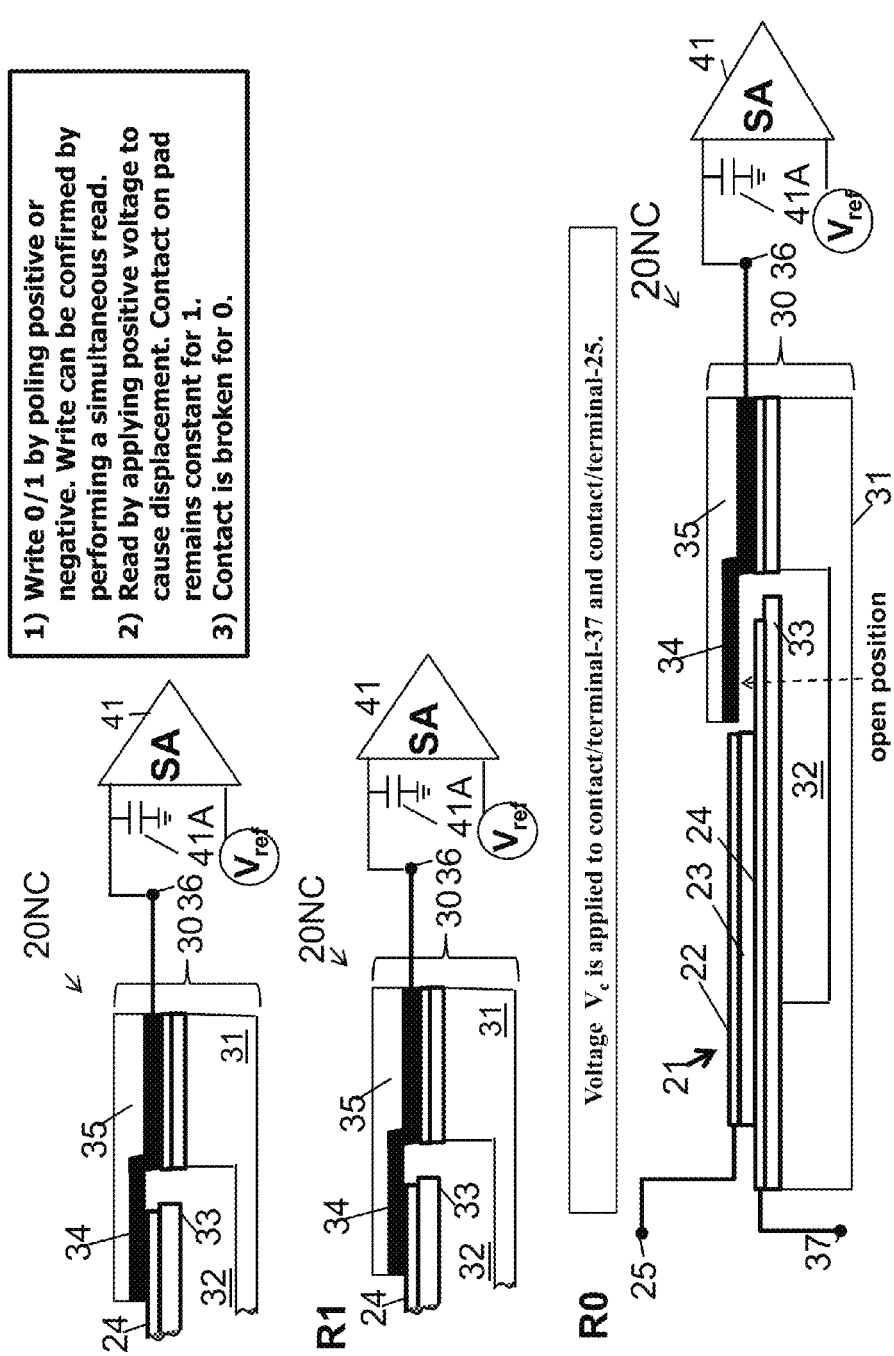
FIG. 10A – Normally-Closed Single-Contact Switch/Memory Cell Designs

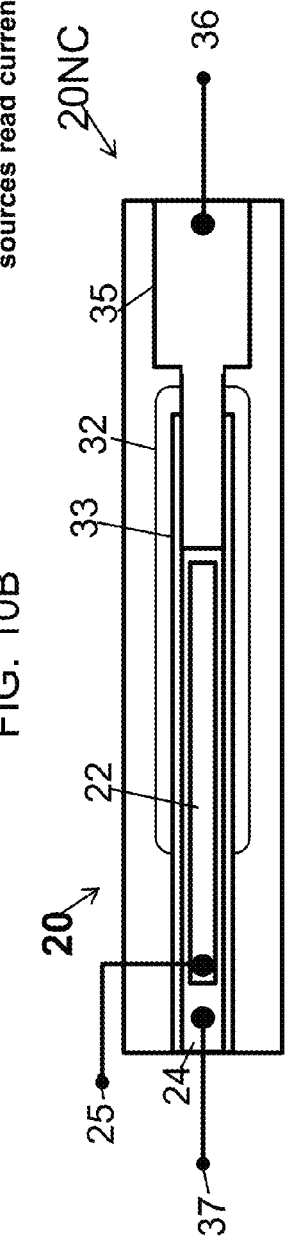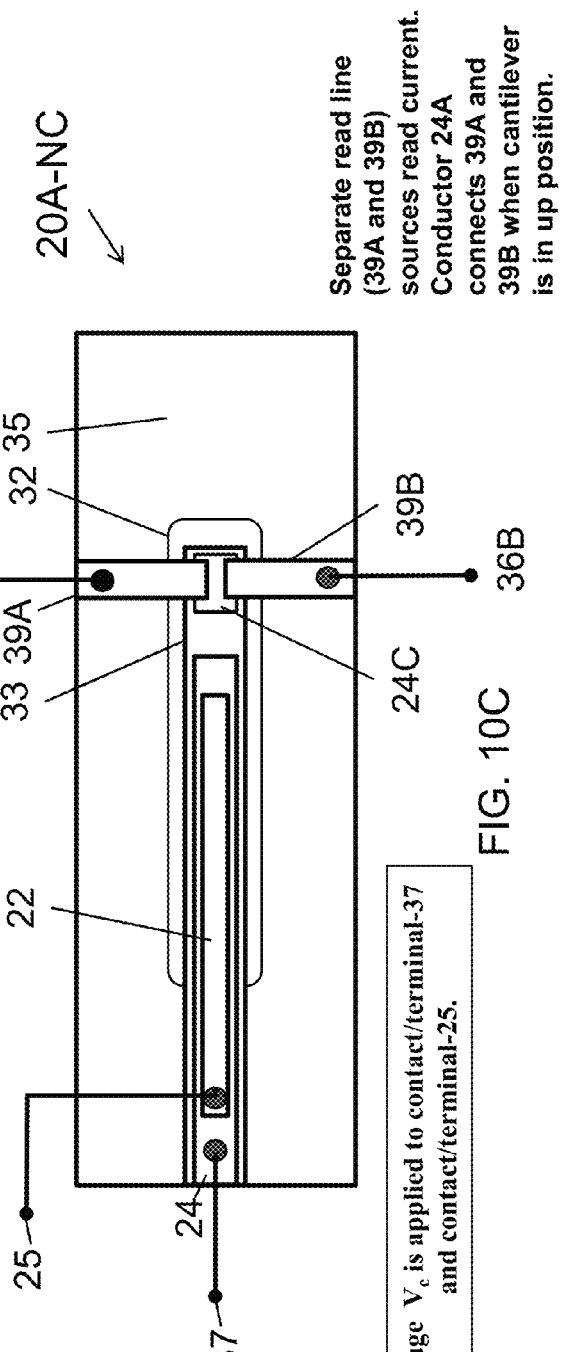

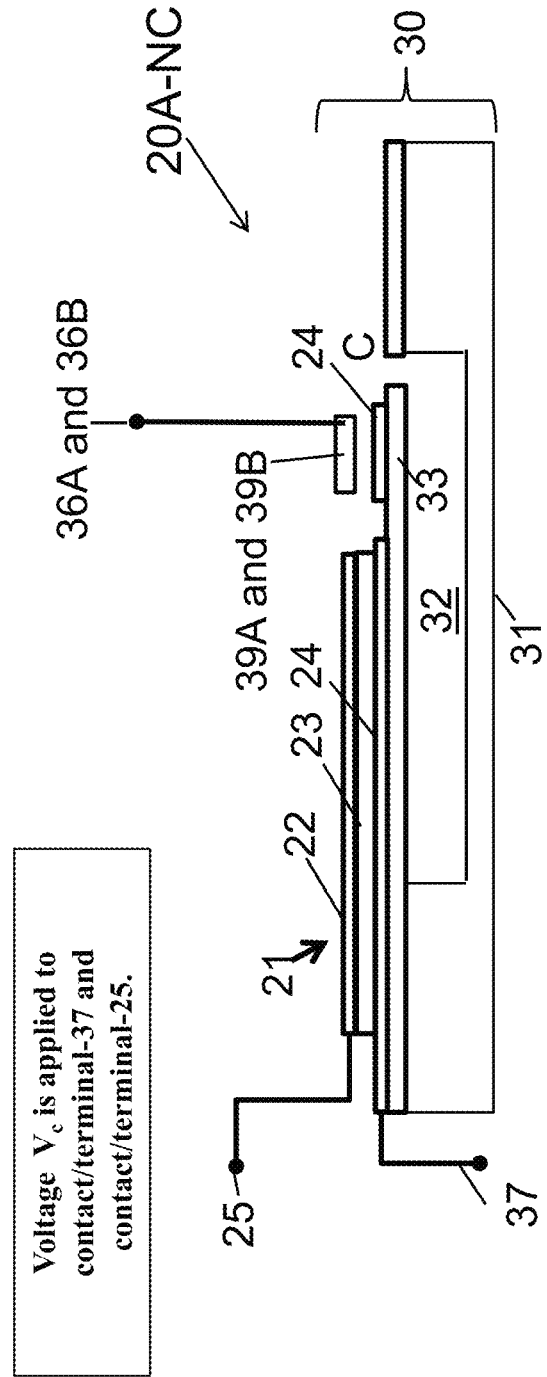
Fig. 10D Single-Switch/Single Capacitor, Normally-closed Cell, 4-terminal device. Switch is shown in 0-state.

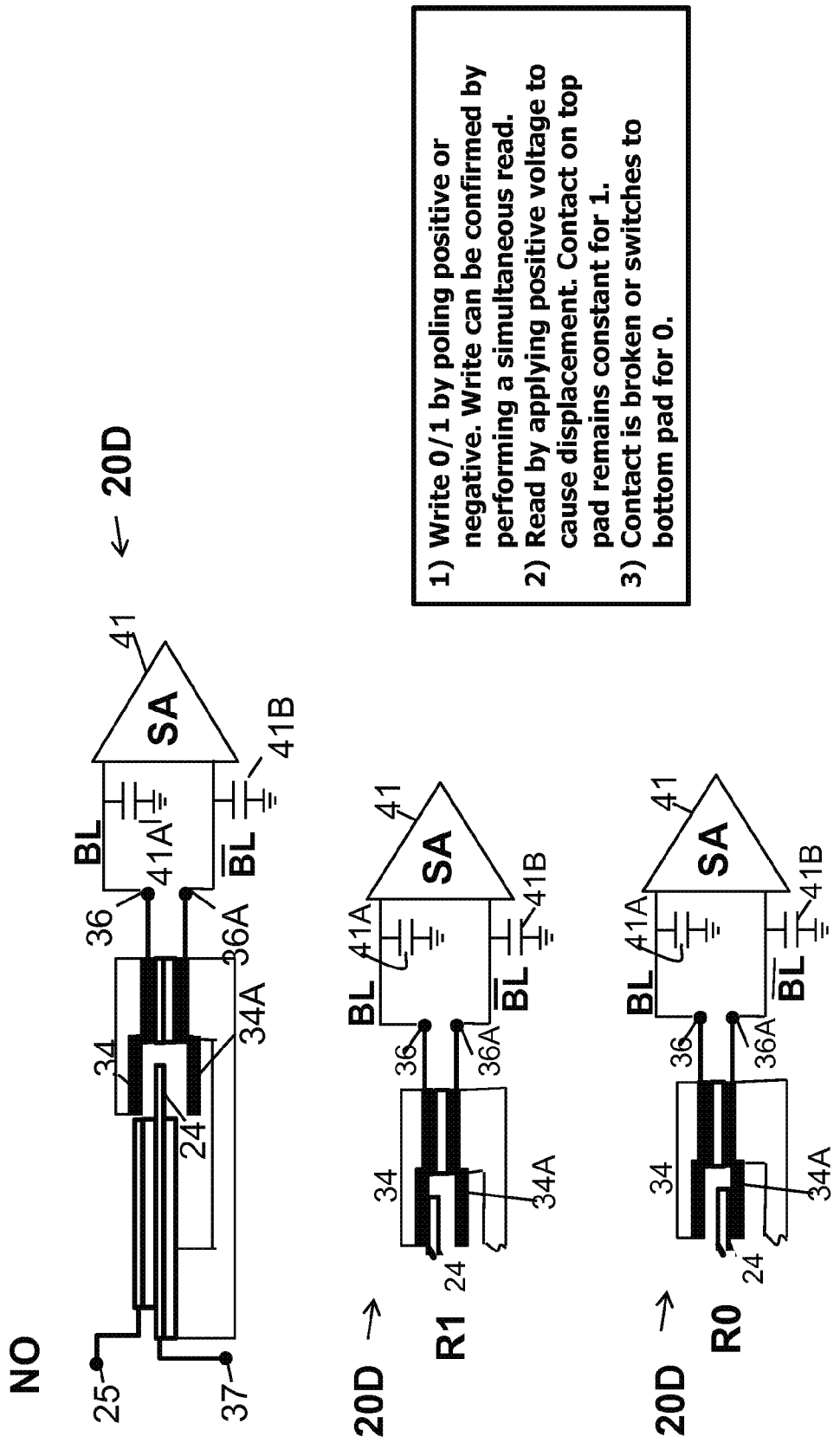
FIG. 11A – Normally-Open Dual-Contact Switch/Memory Cell Designs

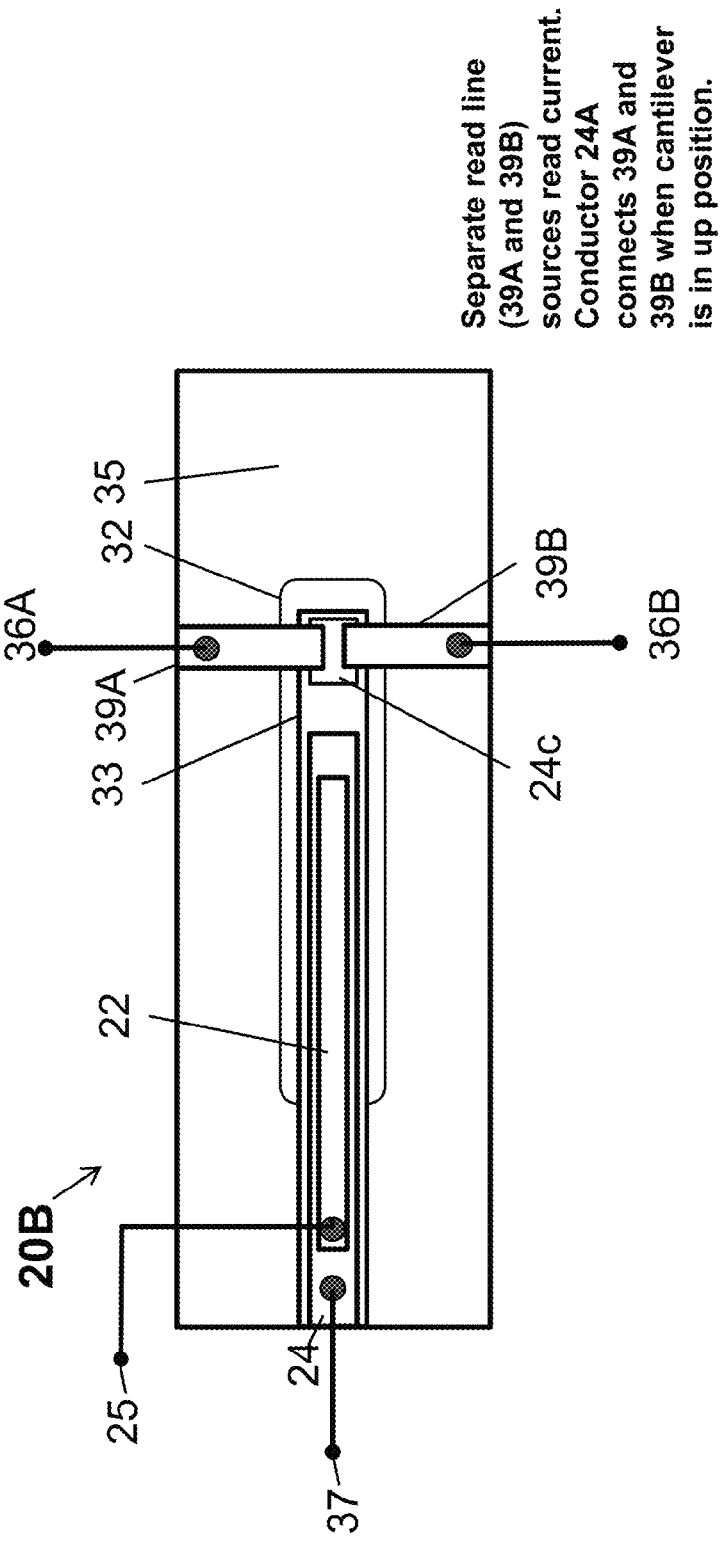

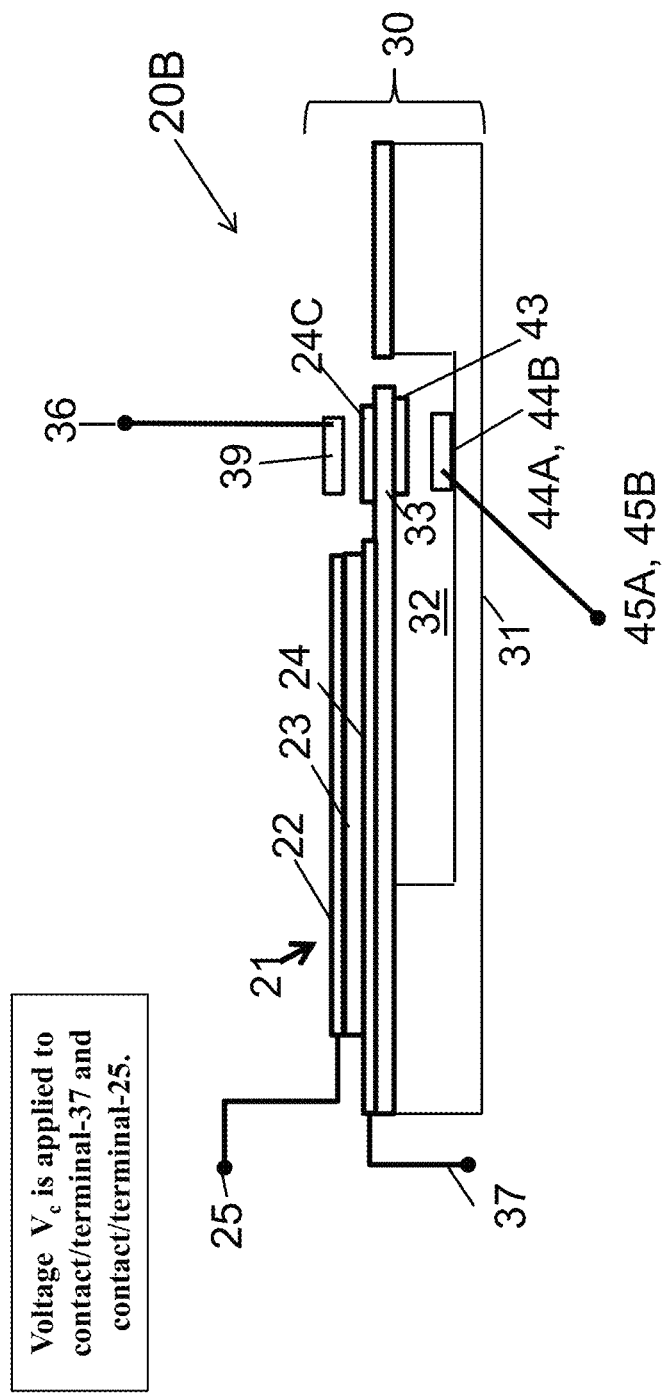
Fig. 11C Single-Switch/Single Capacitor, Normally-Open Cell, dual contact device. Switch is shown in the non-contact state.

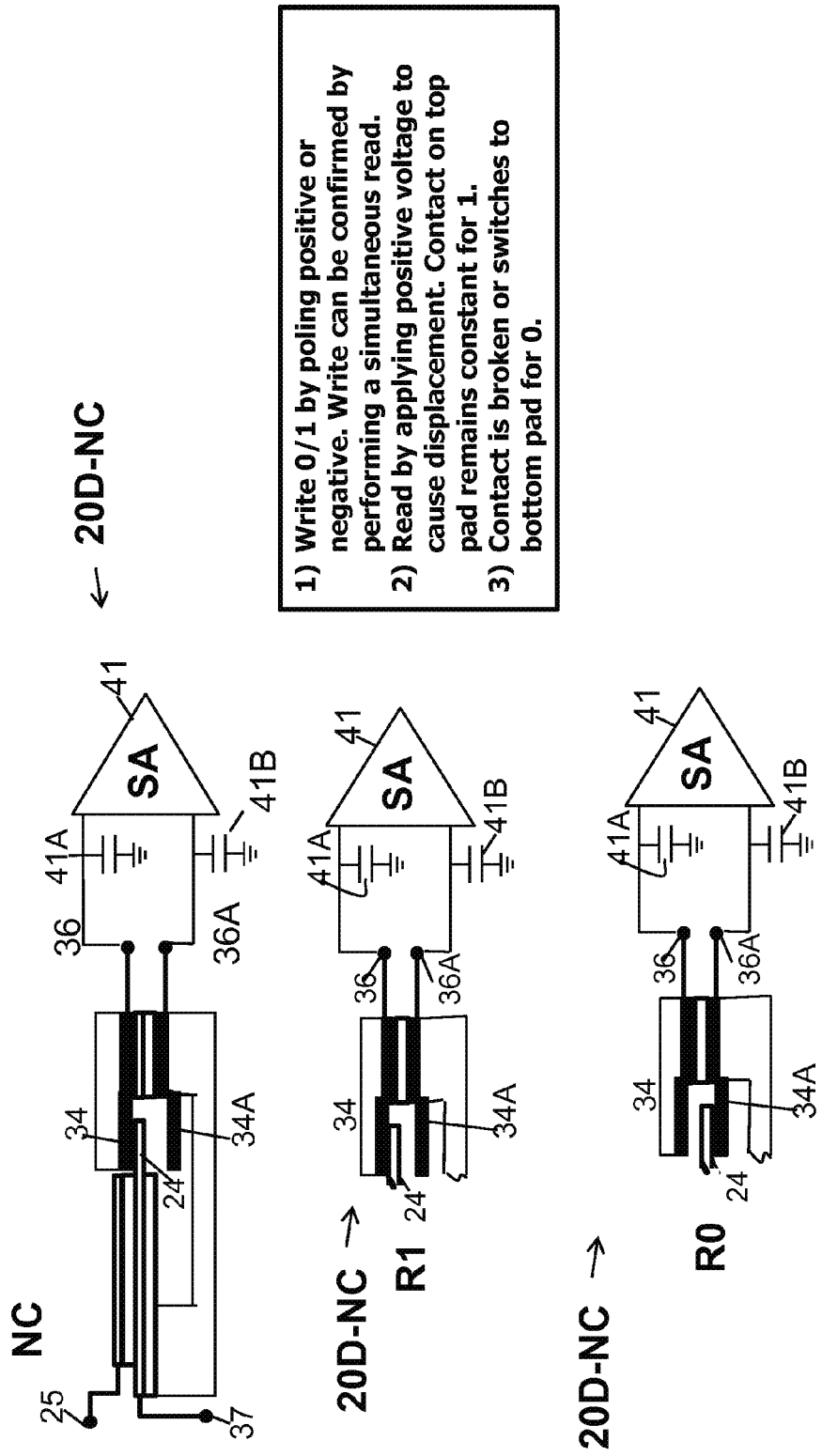
FIG. 12A – Normally-Closed Dual-Contact Switch/Memory Cell Designs

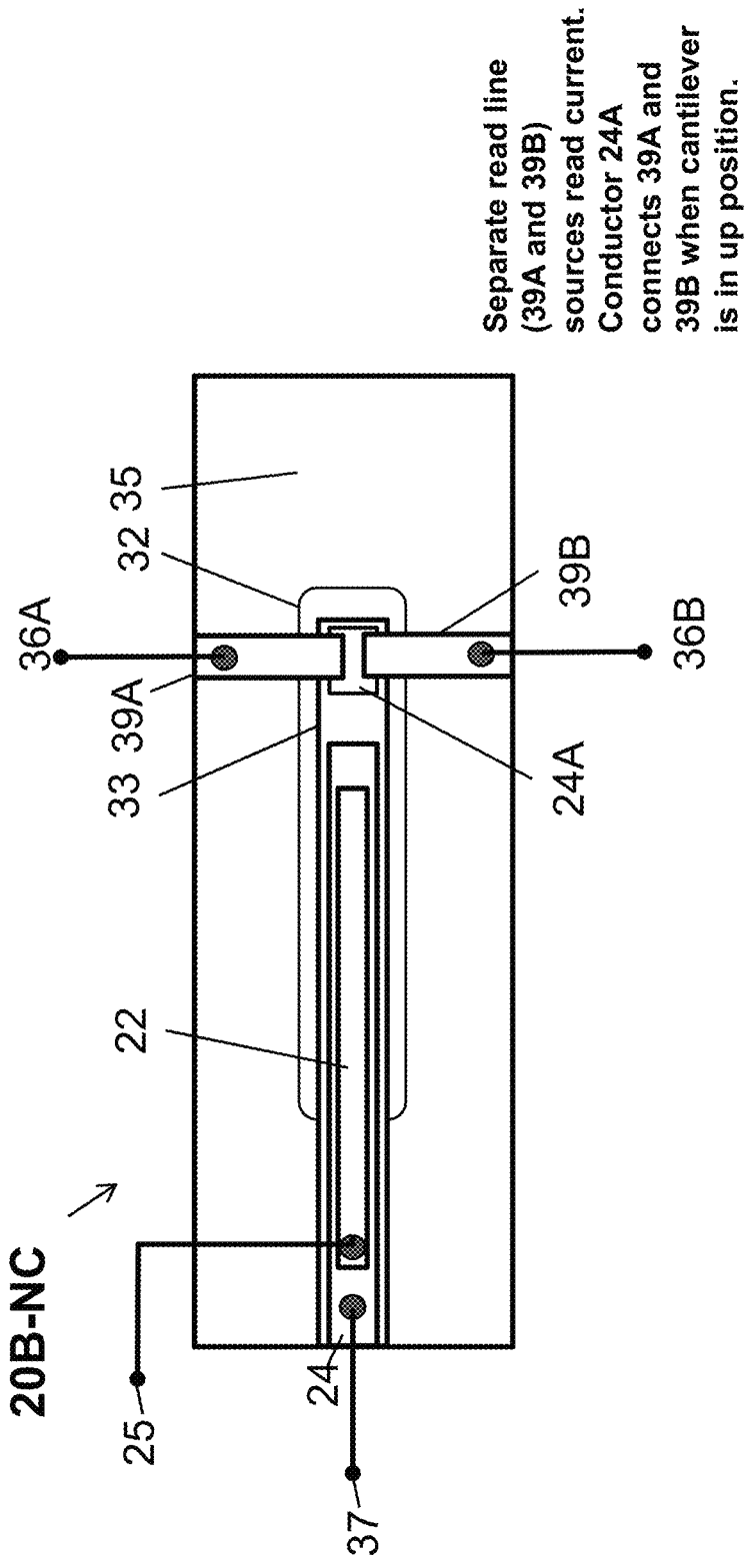

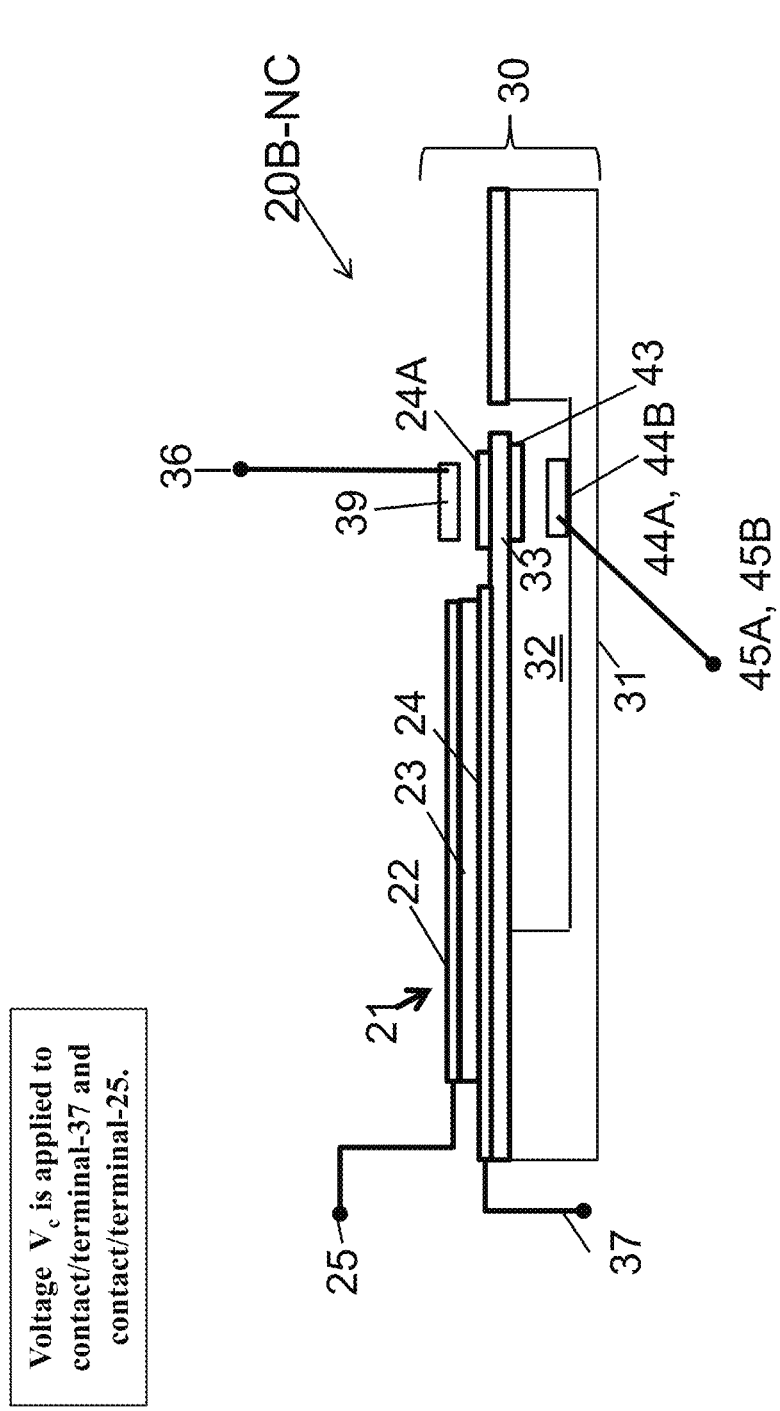
Fig. 12C Single-Switch/Single Capacitor, Normally-closed Cell, dual contact device. Switch is shown in the non-contact state.

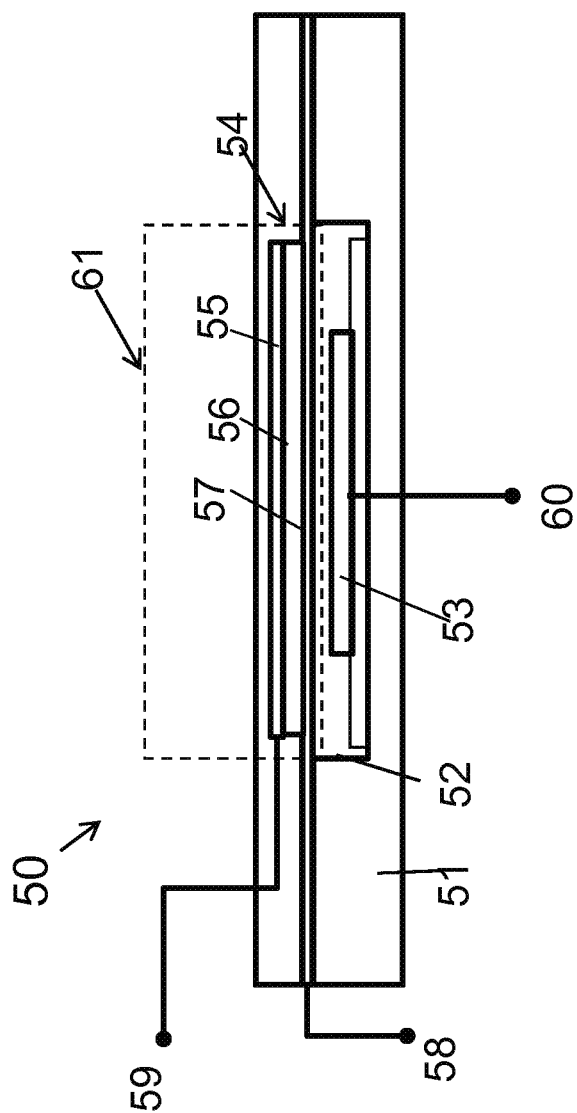
Fig. 13 Single-Switch/Single Capacitor Normally-Open Diaphram Cell

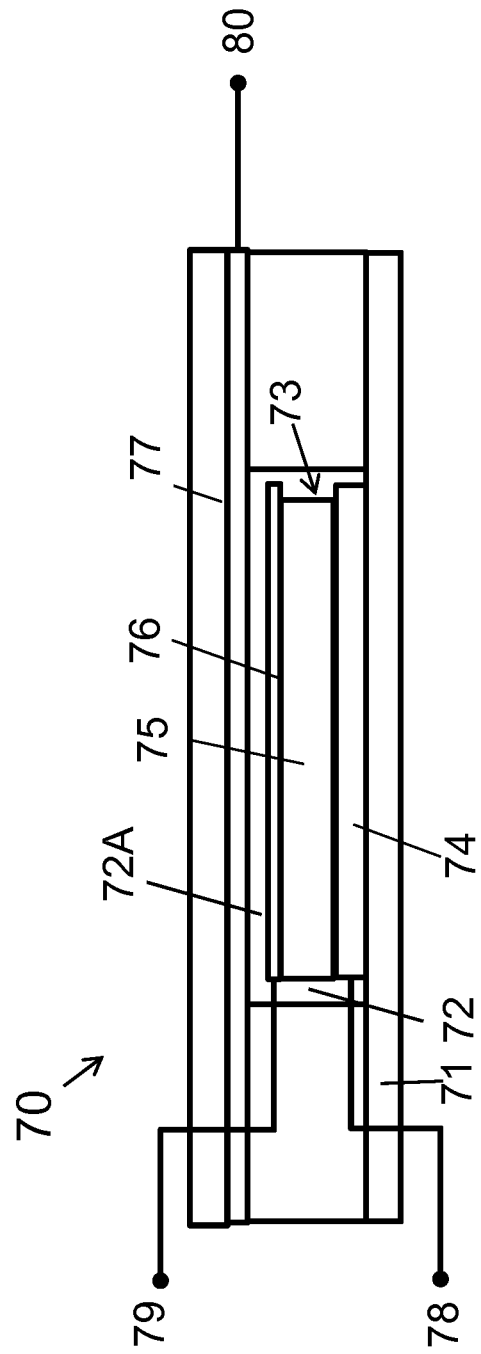
Fig. 14 Single-Switch/Single Capacitor Normally-Open, 3-terminal, Actuator Stack Cell

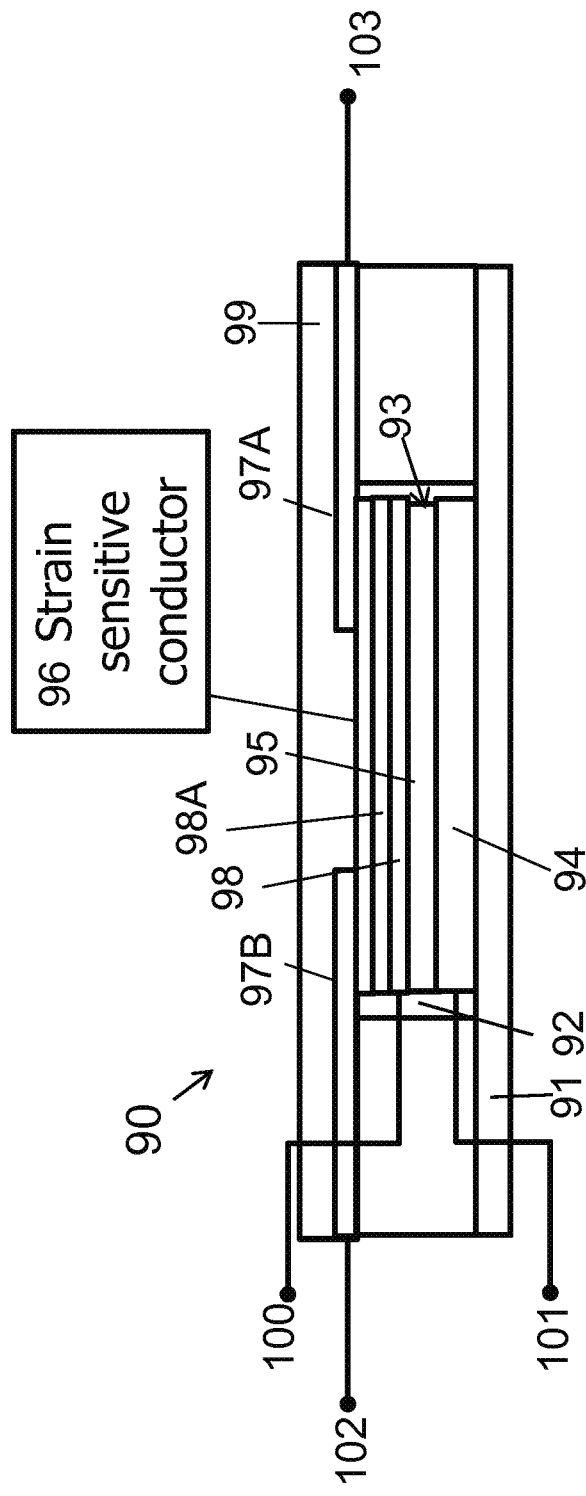
Fig. 15 Single-Switch/Single Capacitor Normally-Open, 4-terminal, Actuator Stack Cell, with strain sensitive conduction layer.

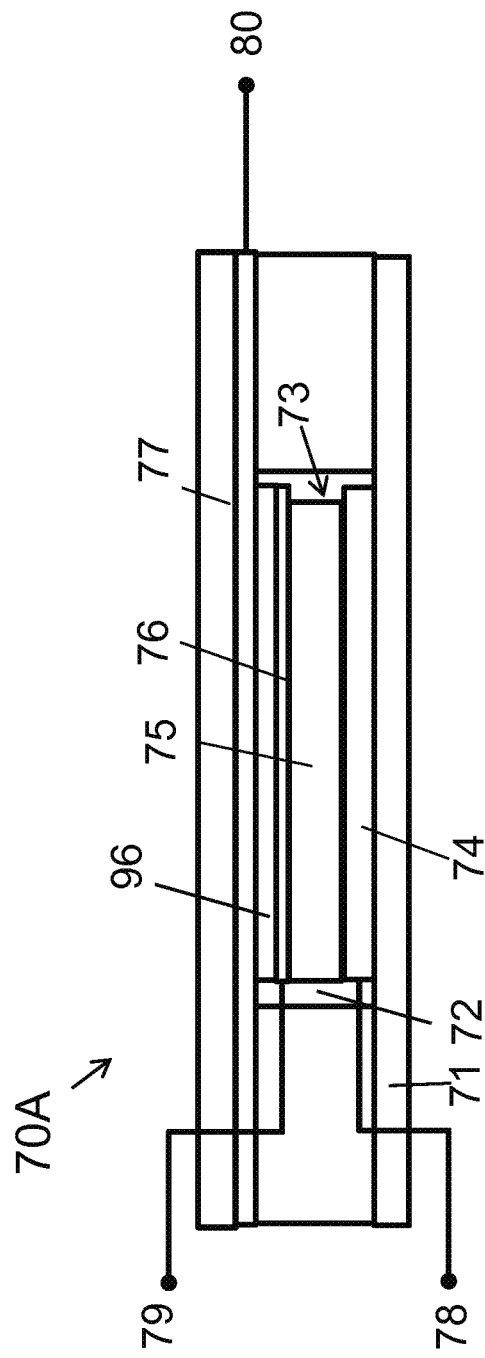
Fig. 16 Single-Switch/Single Capacitor Normally-Open, 3-terminal, Actuator Stack Cell, with strain sensitive conduction layer.

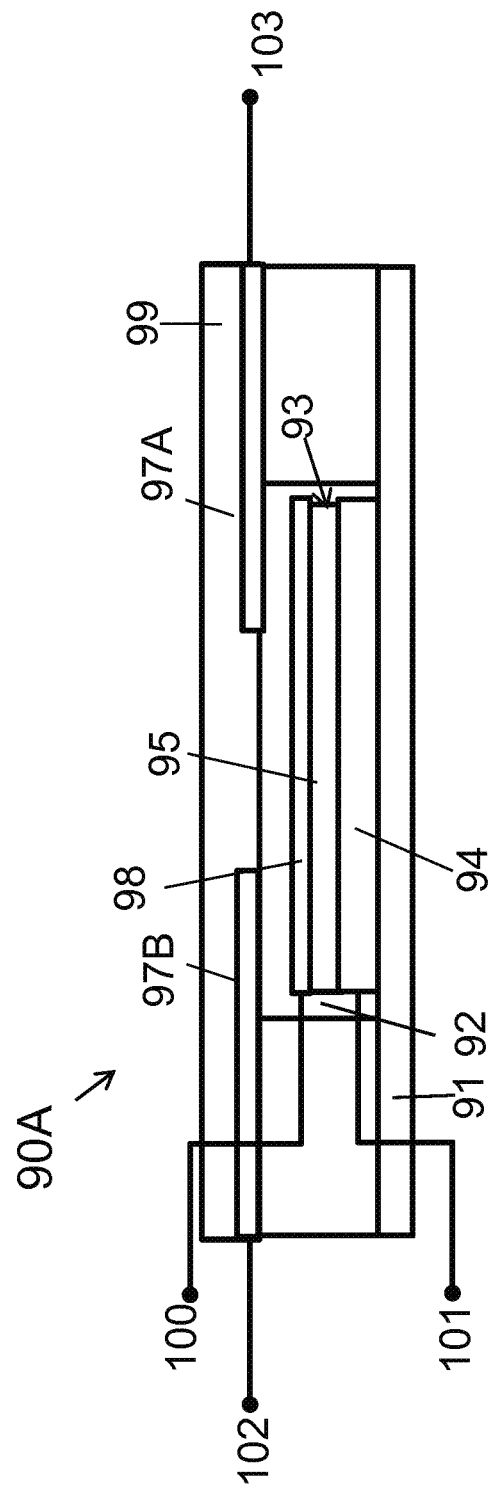
Fig. 17 Single-Switch/Single Capacitor Normally-Open, 4-terminal, Actuator Stack Cell

FERROELECTRIC MECHANICAL MEMORY AND METHOD

CROSS REFERENCE TO RELATED APPLICATIONS

This application claims the benefit of U.S. patent application Ser. No. 14/645,711 (AL 13-32) entitled "Ferroelectric Mechanical Memory and Method," filed Mar. 12, 2015, by Glen R. Fox, et al., which will issue as U.S. Pat. No. 9,385,306 on Jul. 5, 2016. This application also claims the benefit of U.S. Provisional Application No. 61/953,403 entitled "Ferroelectric Mechanical Memory and Method," filed Mar. 14, 2014, by Glen R. Fox, et al., both of which are incorporated by reference.

STATEMENT OF GOVERNMENT INTEREST

The invention described herein may be manufactured, used, and licensed by or for the United States Government without the payment of royalties.

BACKGROUND OF THE INVENTION

The present invention relates to ferroelectric mechanical memory devices. Ferroelectric memory devices reported in patent and scientific publications and that are available commercially, employ a ferroelectric capacitor that can be switched between at least two different non-volatile polarization states. The remanant polarization, i.e., data state, stored in the ferroelectric capacitor is determined by sensing the charge flow or voltage generated on an external circuit which is driven by the switching of the ferroelectric polarization. Typical memory cell architectures consist of 1) a ferroelectric capacitor in series with a transistor, known as a Ferroelectric RAM (FRAM), or 2) a ferroelectric capacitor placed on top and in series with the capacitor formed by the gate and gate-oxide of a MOSFET, which is commonly referred to as a ferroelectric FET (FEFET). The Ferroelectric RAM (FRAM) architecture case uses a sensing method that employs the memory array bit line as a charge sharing capacitor for sensing the charge generated during polarization switching (or non-switching) of the ferroelectric cell capacitor. The structure of the ferroelectric cell capacitor includes a ferroelectric material, such as lead zirconate titanate (PZT). Upon application of an electric field to the FRAM cell capacitor, the dipoles tend to align themselves with the field direction and retain their polarization state after removal of the electric field, which results in storage of one of two possible electric polarizations in each data storage cell; either binary "0"s and "1"s.

SUMMARY OF THE INVENTION

The present invention is directed to a method of making a memory device comprising two electrically conductive layers adapted to be connected to a voltage source; providing a ferroelectric layer positioned between the two conductive layers; the ferroelectric layer comprising a fixed portion and a movable portion; the movable portion being displaced a predetermined distance from a first position to a second position upon application of a positive or negative voltage between the two conductive layers; providing a first contact operatively connectable to at least one of the two conductive layers; the application of one of a positive or negative voltage from the voltage source causing movement of the movable portion from the first to the second position resulting in operative electrical connection between at least one of the two conductive layers and the contact; the ferroelectric layer being configured to retain a first state if a positive voltage is applied and a second state if a negative voltage is applied. Optionally, the memory device may include a base with the fixed portion being operatively connected to the base.

As a further optional configurations, the memory cell may be configured such that the application of a positive charge from the voltage source causes a first state of deformation within the ferroelectric layer and the application of a negative charge causes a second state of deformation within the ferroelectric layer, the subsequent application of a voltage across the one of the two conductive layers and the contact operates to determine whether the ferroelectric layer is in the first or second state. Alternatively, the application of a positive or negative voltage to the two conductive layers results in different internal deformation of the ferroelectric material that can be used to store either a one or zero binary bit such that a subsequent voltage across the memory cell operates to determine whether a one or zero has been stored. Optionally, following the configuration of the ferroelectric into one of the first or second states, upon application of a subsequent voltage, the opening and closing of the operative connection to the contact by the displacement of the ferroelectric layer operates operates as a read operation of the nonvolatile memory device. As a further option, a sensor may be operatively connected to the contact to sense the opening and closing of the operative connection to the contact vis-à-vis the conductive layer 24 (and indirectly the cantilever subassembly comprising the conductive layers 22, 24, ferroelectric layer 23, and resilient layer 33). As a further alternative, the two conductive layers and ferroelectric layer form a capacitor, each of the at least two conductive layers being adapted to connected to a voltage source causing movement of the movable portion of the ferroelectric layer the results in the capacitor becoming operatively connected to the contact causing residual deformation of the ferroelectric layer. Alternatively, the capacitor may be operatively associated with the cantilever such that the cantilever operatively connects to the contact and continues to be operatively connected with the contact as long as voltage is applied to the ferroelectric capacitor. The ferroelectric layer may comprise any one of PbZr0.52Ti0.48O3), (1-x)PbMg1/3Nb2/3O3-(x)PbTiO3, BaTiO3, KNaNbO3, LiNbO3, LiTaO3, doped (Mg, Y, Ca, Si, Hf etc) undoped ZrO2, HfO2, SrBi2Ta2O9, SrBi2Ti2O9, Bi4Ti3O12, Pb5Ge3O11, lead meta-niobate, and doped and undoped Mg, Y, Ca, Si, Zr, In an alternate method of making the ferroelectric layer, a piezoelectric and the two electrically conductive layers are operatively connected to first and second terminal contacts and application of a positive voltage to the first and second contacts induces a positive displacement of the cantilever due to ferroelectric domain reorientation and converse piezoelectric straining of the ferroelectric layer. As a further option, the application of one of a positive or negative voltage to the ferroelectric layer from the voltage source is 0.5 to 1 MV/cm, and is reversed before reaching the breakdown limit.

Optionally, the method of making the memory device may comprise a second ferroelectric layer positioned between two second conductive layers that has fixed portion and movable portions; the movable portion being displaced a predetermined distance from a first position to a second position upon application of a positive or negative voltage between the two second conductive layers; and a second contact operatively connectable to at least one of the two second conductive layers and to one of a voltage potential or ground; the application of one of a positive or negative voltage from the voltage source causing movement of the movable portion from the first to the second position resulting in operative electrical connection between at least one of the two second conductive layers and the second contact; the second ferroelectric layer being configured to retain a first state if a positive voltage is applied and a second state if a negative voltage is applied; whereupon the memory device has four possible states, the first and second states of the first ferroelectric layer and the first and second states of the second ferroelectric layer.

The present invention is also directed to a method of making a memory cell comprising forming a ferroelectric layer; the ferroelectric layer have at least two sides; forming a capacitor by placing conductive layers on at least two sides of the ferroelectric layer; the conductive layers adapted to be connected to a voltage source; securing at least one end of the capacitor while allowing the capacitor to flex into first and second positions; the capacitor flexing into the second position upon application of a voltage from the voltage source; a first contact, the capacitor being in operative electrical connection with the first contact in the second position; the voltage source operative to apply a positive or negative voltage to the ferroelectric capacitor causing different internal deformation of the ferroelectric layers depending upon whether a positive or negative voltage was applied, and wherein the deformation can be used to store either a one or zero binary bit, and wherein a subsequent voltage across the ferroelectric capacitor operates to determine whether a one or zero has been stored based upon operative electrical contact between the first contact and the capacitor.

Alternatively, the method includes providing a base. Alternatively, the ferroelectric capacitor forms part of a cantilever subassembly wherein a first portion of the cantilever subassembly is secured to the base and the second portion moves from the first position to the second position, the capacitor flexing in the second position to allow operative electrical connection to the contact. Alternatively, the method further comprises providing a sensor (such as a sense amplifier) operatively connected to the contact to sense the opening and closing of the operative connection to the contact such that during a read operation, the sensor is used to detect one of the amount of time the contact is in operative electrical connection with the voltage source.

The ferroelectric material (ferroelectric layer) may comprise, but is not limited to, lead zirconate titanate (which may be for example $PbZr_{0.52}Ti_{0.48}O_3$), $(1-x)PbMg1/3Nb_2/3O_3-(x)PbTiO_3$, $BaTiO_3$, $KNaNbO3$, $LiNbO_3$, $LiTaO_3$, doped (Mg, Y, Ca, Si, Hf etc) and undoped $ZrO_2$, doped and undoped (Mg, Y, Ca, Si, Zr etc.) $HfO_2$, $SrBi_2Ta2O_9$, $SrBi_2Ti_2O_9$, $Bi_4Ti_3O_{12}$, $Pb_5Ge_3O_{11}$, lead meta-niobate, and polyvinylidene fluoride. Moreover, as a further option, since anti-ferroelectric materials exhibit similar strain versus electric field hysteresis behavior as that observed in ferroelectrics, the ferroelectric layer could be replaced with an anti-ferroelectric, e.g. $PbZrO_3$.

BRIEF DESCRIPTION OF THE DRAWINGS

The foregoing and other objects, features, and advantages of the invention will be apparent from the following more detailed description of the preferred embodiments of the invention, as illustrated in the accompanying drawings, wherein:

FIG. 3 is a graphical illustration showing ideal displacement vs. voltage for the case of a poled ferroelectric switch. The displacement origin is relative to the poled ferroelectric and zero applied electric field state.

FIG. 4A is a schematic illustration of a side view of a preferred embodiment 20 of the present invention comprising a single switch. The switch/single capacitor forms a normally open memory cell.

FIG. 4B is a schematic illustration of a top view of the preferred embodiment 20 of FIG. 4A.

FIG. 4C is a schematic illustration of a top view of an alternate preferred embodiment 20DS of the present invention comprising a double switch/double capacitor cell.

FIG. 4D is a schematic illustration of a side view of an alternate preferred embodiment 20D of the present invention comprising a single switch with upper and lower contacts. The switch/single capacitor forms a normally open memory cell.

FIG. 4E is a schematic illustration of a top view of an alternate preferred embodiment of the present invention 20D comprising a single switch with upper and lower contacts. The switch/single capacitor forms a normally open memory cell.

FIG. 5A is a graphical illustration of single pulse write memory operations and the bipolar displacement memory states.

FIG. 6A is a graphical illustration of a single unipolar pulse read memory operation performable on a preferred embodiment 20.

FIG. 6B is an illustration of applied voltage, displacements, and the voltage measured on a sense capacitor for a read-1 and read-0 case FIG. 7A is a schematic illustration normally-open single-contact Switch/Memory Cell design further comprising a sense capacitor 41A and amplifier 41 connected to the preferred embodiment 20 (shown schematically) depicting read operations R0 and R1 of "0" and "1" bits, respectively.

FIG. 7B is a top view schematic illustration depicting a preferred embodiment 20 having a conductive layer 24 that connects to the contact layer 34 (located underneath the cover insulator 35).

FIG. 7C is a top view schematic illustration depicting a preferred embodiment 20A having a separated conductive layers 39A and 39A.

FIG. 7D is a side view schematic illustration depicting the preferred embodiment 20A having separated conductive layers 39A and 39B.

FIG. 7E is a top view schematic illustration depicting a preferred embodiment 20A showing the conductive layer 39B that connects to a sense capacitor 41A and sense amplifier 41.

FIG. 8A is an illustration showing a second, alternative, read method that uses unipolar ramp pulsing of the applied ferroelectric capacitor voltage with magnitude above $V_c$.

FIG. 8B depicts a single saturated unipolar pulse read for a 1-state and 0-state and the corresponding displacement and sense voltage.

FIG. 9A schematically illustrates the preferred embodiment 20 the position of the conductive layer 24 relative to the contact layer 34 for the preferred embodiment 20 of FIG. 4A.

FIG. 9B schematically illustrates the preferred embodiment 20D normally-open dual-contact switch designs; a generalized case comprising conductive layer 24, contact layer 34 and contacts 36, 36A, and 37.

FIG. 9C schematically illustrates the preferred embodiment 20 NC (the preferred embodiment 20 in a normally-closed single-contact switch design); a generalized case comprising conductive layer 24, contact layer 34 and contacts 36 and 37.

FIG. 9D schematically illustrates the preferred embodiment 20D-NC: normally-closed dual-contact switch designs; comprising conductive layer 24, contact layer 34 and contacts 36,36A, and 37.

FIG. 10A is a side view schematic illustration depicting preferred embodiment 20NC (preferred embodiment 20 in a normally closed configuration) comprising a cantilever subassembly (contact layers 22, 24, ferroelectric layer 23, and resilient layer 33 that 9 is elevated to a positioned closed relative to the contact layer 34. FIG. 10A also shows the resulting position of the cantilever subassembly and contact layer 34 following reading of a "1" (R1) and "0" (R0).

FIG. 10B is a top view schematic illustration depicting a preferred embodiment 20 NC (normally closed)

FIG. 10C is a top view schematic illustration depicting a preferred embodiment 20A-NC (normally closed) having a separated conductive layers 39A, 39B that sources the read current.

FIG. 10D is a side view schematic illustration depicting a preferred embodiment 20A-NC (normally closed) having a separate read line 39 that sources the read current.

FIG. 11A schematically illustrates a normally-open dual-contact switch, such as the preferred embodiment 20D illustrated in FIGS. 4D and 4E above.

FIG. 11B is a top view schematic illustration depicting a preferred embodiment 20B having two separated sets of conductive layers, upper 39A and 39B, and lower 44A and 44B (shown in FIG. 11C).

FIG. 11C is a side view schematic illustration depicting a preferred embodiment design having two sets of separate conductive layers, upper 39A and 39B and lower 44A and 44B, that sources the read current.

FIG. 12A schematically illustrates a preferred embodiment 20D-NC (dual contact, normally-closed) memory cell.

FIG. 12B is a top view schematic illustration depicting a preferred embodiment 20B (dual separated contact, normally closed) having two sets of separate conductive layers, upper 39A, 39B and lower 44A, 44B, that source the read current.

FIG. 12C is a side view schematic illustration depicting a preferred embodiment 20B-NC (dual separated contact, normally closed) having two sets of separate conductive layers, upper 39A, 39B, and lower 44A, 44B, that sources the read current.

FIG. 13 is a schematic illustration of an alternate preferred embodiment 50 comprising a diaphragm cell comprising a base 51, a cavity 52, a ferroelectric capacitor 54, and a contact 53.

FIG. 14 is a schematic illustration of an alternate preferred embodiment 70 comprising a base 71, a cavity 72 a ferroelectric capacitor 73, and a contact 77

FIG. 15 is a schematic illustration of an alternate preferred embodiment 90b comprising a base 91, a cavity 92, ferroelectric capacitor 93, a strain sensitive conductor 96 and a contact 97.

FIG. 16 is a schematic illustration of an alternate preferred embodiment 70A (three terminal device) that comprises a ferroelectric capacitor actuator stack 73 and strain sensitive conduction layer 96.

FIG. 17 is a schematic illustration of a preferred embodiment 90A (a four terminal device) that comprises a ferroelectric capacitor actuator stack 73.

Figure 1:
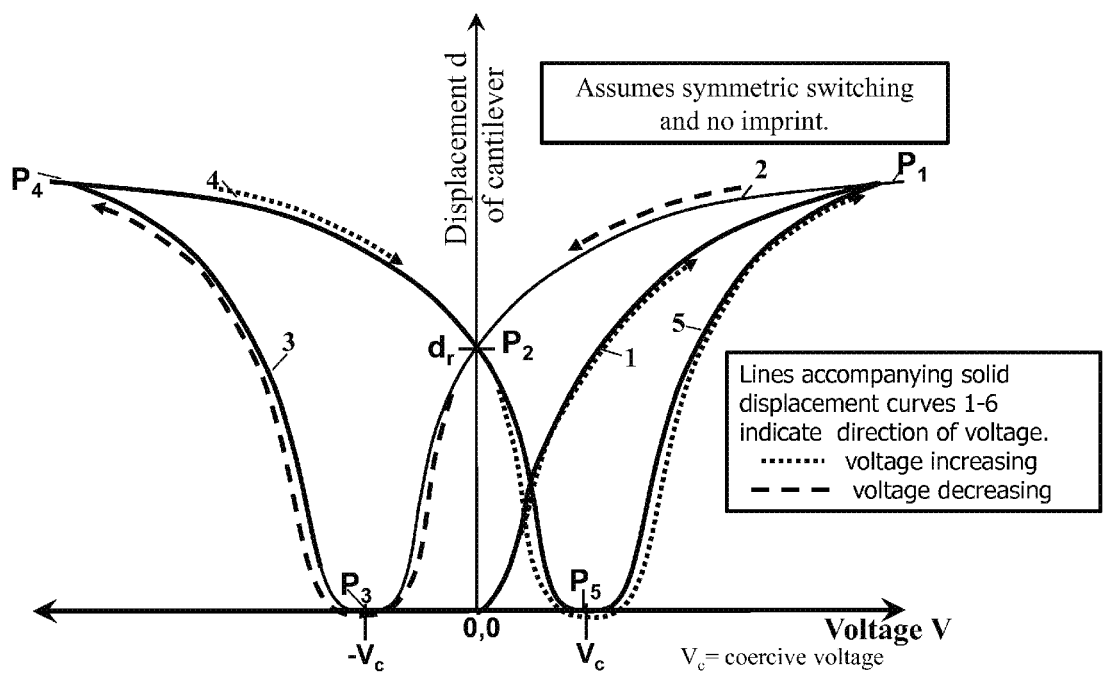
FIG. 1 is a graphical illustration showing ideal displacement vs. voltage for the case of a virgin ferroelectric switch, assuming symmetric switching and no imprint. The displacement origin corresponds to the virgin state (i.e., before any voltage is applied).

A more complete appreciation of the invention will be readily obtained by reference to the following Description of the Preferred Embodiments and the accompanying drawings in which like numerals in different figures represent the same structures or elements. The representations in each of the figures are diagrammatic and no attempt is made to indicate actual scales or precise ratios. Proportional relationships are shown as approximates.

DESCRIPTION OF THE PREFERRED EMBODIMENTS

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention. Rather, these embodiments are provided so that this disclosure will be thorough and complete, and will fully convey the scope of the invention to those skilled in the art. In the drawings, the dimensions of objects and regions may be exaggerated for clarity. Like numbers refer to like elements throughout. As used herein the term "and/or" includes any and all combinations of one or more of the associated listed items.

The terminology used herein is for the purpose of describing particular embodiments only and is not intended to limit the full scope of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as an object, layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, components, regions, layers and/or sections, these elements, components, regions, layers and/or sections should not be limited by these terms. For example, when referring first and second photons in a photon pair, these terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to other elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below. Furthermore, the term "outer" may be used to refer to a surface and/or layer that is farthest away from a substrate.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region or object illustrated as a rectangular will, typically, have tapered, rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will also be appreciated by those of skill in the art that references to a structure or feature that is disposed "adjacent" another feature may have portions that overlap or underlie the adjacent feature.

The present invention may be implemented, inter alia, by the combination of a ferroelectric capacitor and a MEMS switch, which in effect provides a switch with a non-volatile memory. This non-volatile ferroelectric mechanical memory uses the ability to switch between two different states of the piezoelectric induced mechanical displacement of the ferroelectric element integrated with the MEMS switch. In addition to nonvolatile memories, the device can be used, for example, to make non-volatile logic devices, relays and switch networks that do not require transistors.

The present invention is directed to, inter alia, a memory cell architecture that uses a ferroelectric material, but unlike FRAMs, relies on the mechanical deformation resulting from the converse piezoelectric response to define and sense the data state stored in the cell. With ferroelectric materials, the dimensions of the material can change under applied electric field. At low fields, the dimensional changes are linear and can be described by the piezoelectric constitutive equations. Under high applied electric field, the dimensional changes of a ferroelectric material exhibits nonlinear hysteretic behavior because of realignment or switching of the polar ferroelectric domains. The hysteretic behavior of the ferroelectric results in remanant (i.e., remaining in a strained state while no longer under external electric influence) dimensional changes that can be utilized for construction of non-volatile memory devices (i.e., memory devices that store data states even after the device power is turned off).

Hysteretic dimensional changes can be manifested in longitudinal, transverse and shear strains induced by an electric field applied to the ferroelectric material. As a result of the multiple strain modes, ferroelectric-mechanical-memory (FEMM) devices can be designed with a wide variety of operation modes and architectures. Preferred embodiment ferroelectric-mechanical-memory devices comprise a cantilever MEMS device architecture that uses ferroelectric transverse remnant displacement for data state storage and changes in circuit conduction for data state sensing. It is readily apparent to those of ordinary skill in the art that additional embodiments that have non-volatile memory designs that utilize alternative MEMS architectures, ferroelectric mechanical displacement (or strain) modes and data sensing methods may be developed without departing from the scope of the present invention.

Although not a requirement of the invention, when using a ferroelectric layer, the deformation may be obtained through compensating volumes of positively and negatively poled domains, and continued increase in the magnitude of the voltage reorients additional polar domains which leads to a net increase in transverse ferroelectric strain and corresponding positive structural displacement of the ferroelectric second portion. When the voltage across the capacitor is decreased to zero voltage, the ferroelectric domains remain oriented in the direction of the previously applied electric field causing part of the strain and correlated structural displacement to persist, which results in non-volatile data storage in the memory device.

The ferroelectric layer may be poled such that the ferroelectric layer returns to its original state when the voltage across the ferroelectric layer is zero. At least two electrically conductive layers (electrodes) may be used to activate the ferroelectric layer whereby upon application of a positive voltage to the electrodes, the ferroelectric layer induces a positive displacement of the movable second portion due to ferroelectric domain reorientation and converse piezoelectric straining of the ferroelectric film. As a further option, voltage applied to the two electrically conductive layers is reversed when the displacement of the second portion asymptotically approaches a maximum value at electric fields approaching 0.5 to 2 MV/cm. At this point dielectric breakdown can occur in the ferroelectric layer preventing further displacement. When the voltage applied to the ferroelectric is reversed before reaching the breakdown limit, ferroelectric displacement decreases to a remanant displacement of the second portion of the ferroelectric at zero voltage, which is maintained due to a remanant strain of the ferroelectric layer.

Figure 2:
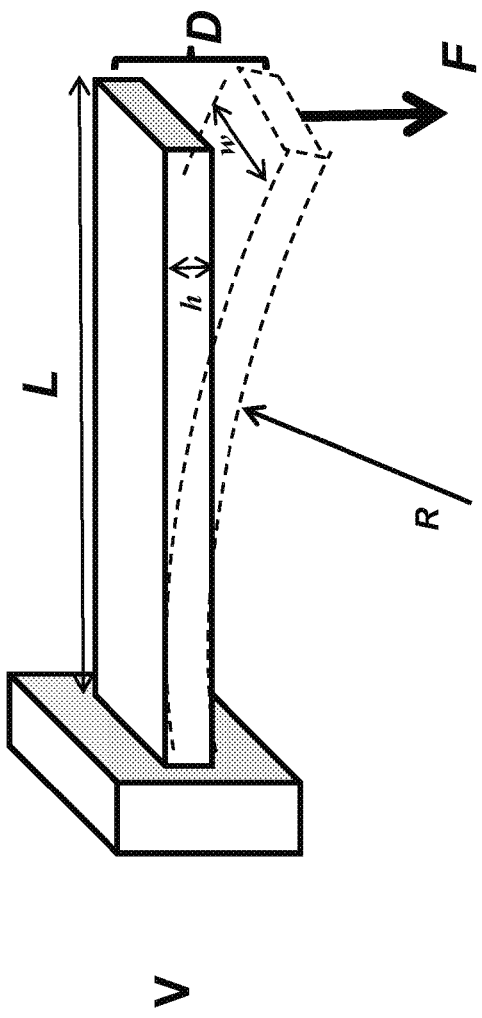
FIG. 2 is an illustration of a generalized case of a cantilever showing, inter alia, force and displacement resulting therefrom.

A representative displacement versus voltage hysteresis loop for an ideal ferroelectric material is shown in FIG. 1. This type of loop is generally observed for longitudinal, transverse and shear displacements although the magnitude, curvature and inflection points of the loop varies based on the measured displacement mode and ferroelectric material dimensions. The origin at (0,0) represents the virgin state, i.e., prior to application of any voltage to the ferroelectric material. An example of transverse displacement of a cantilever structure is shown in FIG. 2. Specifically, FIG. 2 shows a generalized schematic view of the displacement of a traditional cantilever of a length L such that upon application of a normal force F causes a transverse displacement D. In the case of a ferroelectric positioned between two conductors to form a cantilever, the force is applied by a voltage V that strains the ferroelectric and causes an unbalanced strain differential between the ferroelectric and the conductor layers. In the preferred embodiments in FIGS. 4A though 4E, 7A through 7D, 9A through 9D, 10A through 10D, 11A through 11C and 12A through 12C application of a voltage across a ferroelectric film, positioned between two conductive layers, results in transverse strain of the ferroelectric film and subsequent movement. Because the ferroelectric film may form part of a cantilever, or be made integral with a cantilever, the ferroelectric film produces a force that induces a displacement of the cantilever tip that is dependent on the applied voltage. The normal force on the cantilever tip is produced by applying a voltage V that strains the ferroelectric and causes an unbalanced strain differential between the ferroelectric (represented as ferroelectric layer 23 in FIG. 4A) and the conductive layers (shown as conductive layers 22 and 24 in FIG. 4A). FIG. 1 is also representative for an ideal ferroelectric and integrated cantilever tip displacement for cycling through a bipolar applied voltage that causes switching or reorientation of the ferroelectric polarization. Again, it should be noted, that the magnitude, curvature and inflection points of the hysteresis loop depends on the materials and dimensions of the cantilever structure.

For the ideal case, the as-processed cantilever exhibits zero displacement and no curvature. In addition, the ferroelectric film is unpoled (no net remanant polarization or strain) and it exhibits symmetric displacement response to an applied electric field, i.e., the displacement is the same for both voltage polarities. Starting at time t=0, the applied voltage and displacement are equal to zero. Application of a positive voltage to the bottom electrode of the ferroelectric film induces a positive displacement of the cantilever tip (as shown by the dotted curve 1 in FIG. 1) due to ferroelectric domain reorientation (poling) and converse piezoelectric straining of the ferroelectric film. At a sufficiently high voltage, the displacement asymptotically approaches a maximum value (represented by point $P_1$) at electric fields approaching 0.5 to 1 MV/cm (for ferroelectric $Pb_{0.52}Ti_{0.48}O_3$), dielectric breakdown occurs in the ferroelectric preventing further displacement. When the voltage is decreased (dashed curve 2) before reaching the breakdown limit, cantilever displacement decreases, but the rate at which the displacement decreases is slower than that observed during the ramp-up. At zero voltage a remanant displacement ($d_r$) of the cantilever tip is maintained due to a remanant strain of the ferroelectric film. When the voltage is decreased to zero, the ferroelectric domains remain oriented in the direction of the previously applied electric field causing part of the strain and correlated cantilever displacement to persist. The persistence of strain at the zero voltage state provides the origin for non-volatile data storage in a ferroelectric-mechanical-memory device (point $P_2$).

Upon reversing voltage polarity, as represented by the dashed curve 3 in FIG. 1, cantilever displacement continues to decrease monotonically to a minimum and zero displacement (assuming ideal ferroelectric and elastic behavior) at $-V_c$ (point $P_3$), which is called the coercive voltage. The minimum and zero cantilever displacement is reached when the net ferroelectric polarization is eliminated due to electric field induced reorientation of ferroelectric domains and achievement of compensating volumes of positively and negatively poled domains. Continued increase in the magnitude of the negative voltage, reorients additional polar domains and leads to a net increase in transverse ferroelectric strain and corresponding positive cantilever displacement. As observed with positively increasing voltage, cantilever displacement under negative increasing voltage magnitude asymptotically approaches a maximum and the negative drive voltage is limited by dielectric breakdown, represented by point $P_4$ in FIG. 1. Upon increasing voltage from the voltage minimum, represented by dotted curve 4, the cantilever displacement returns to the same remanant displacement value, $d_r$, observed when the applied voltage is decreased from the maximum positive voltage (represented by point $P_2$).

A second cycle to maximum positive voltage, represented by dotted curve 5, does not repeat the trace of the first positive cycle, represented by dotted curve 1, because the ferroelectric domains are fully poled in the negative state at the start of the second positive voltage cycle (represented by point $P_2$). During the second positive increasing voltage ramp, the cantilever tip displaces through a minimum and zero value at $V_c$ (represented by Point $P_5$) and then approaches a maximum upon complete ferroelectric domain reversal (as represented by Point $P_1$. At this point a completely symmetric displacement vs. voltage loop is observed and is repeated (via curve 2) for continued cycling through positive and negative voltages.

Inspection of the symmetrical hysteresis loop reveals that only one displacement state (represented by Point $P_2$) exists at zero voltage, indicating that remanant displacement alone cannot be used to define a non-volatile memory state. One method to introduce non-volatile remanant displacement states at zero voltage is to drive the ferroelectric with asymmetric or sub-saturation voltages that introduce incomplete domain switching and intermediate or sub-loop remnant displacements. Another method includes altering the ferroelectric such that it displays a shift of the displacement vs. voltage hysteresis along the voltage axis resulting in two unique displacement states at zero voltage; this type of hysteresis asymmetry can be introduced by a variety of mechanisms including imprint, composition gradients, hydrogen incorporation, plasma induced modification and electrode/ferroelectric interface imbalances.

A preferred method for defining non-volatile memory states resulting from the ferroelectric displacement vs. voltage hysteresis loop utilizes the difference in the direction of motion of a cantilever driven with the same applied voltage direction but using opposite ferroelectric polarization states. FIG. 3 is a graphical illustration showing an ideal displacement vs. voltage hysteresis loop for the case of a poled ferroelectric switch. Note that the direction of displacement, i.e., the derivative of the hysteresis curve at zero voltage, differs in sign when the device is cycled through either a positive or negative voltage. If desired, the origin of the hysteresis plot can be redefined by shifting the zero displacement state to $d_r$ (point P'$_2$) and the minimum displacement at points P'$_3$ and P'$_5$ is designated $d_o$. A minimum two-state memory device can now be defined. When either a positive or negative voltage is applied to the ferroelectric material after an initial electrical poling, the displacement will be positive or negative depending on both the applied voltage polarity and the pre-induced ferroelectric polarization state. The directional change in displacement with voltage polarity can therefore be used to define a positive and negative memory state. The directional change in displacement can be either correlated or anti-correlated to voltage polarity and is dependent on the pre-induced polarization direction of the ferroelectric.

As shown in FIG. 3, application of a positive voltage to the bottom electrode of the ferroelectric film can induce a positive displacement of the cantilever tip along two different paths (dotted curve 11 and dotted curve 15). If the ferroelectric is poled positive by an immediately preceding positive increasing voltage ramp to point P'$_1$, the displacement will follow curve 11. Alternatively, if the ferroelectric is poled negatively by an immediately preceding negative voltage decrease to point P'$_4$, the displacement will follow curve 15. The time at which the voltage resides at zero after the poling and before the subsequent positive (interrogation or read) voltage increase does not affect the displacement path traveled; therefore, path 11 and 15 define two different non-volatile states for the switch displacement. At a sufficiently high voltage, the displacement along both path 11 and path 15 asymptotically approaches a maximum value (represented by point P'$_1$) and at electric fields approaching 0.5 to 1 MV/cm (for ferroelectric $Pb_{0.52}Ti_{0.48}O_3$), dielectric breakdown occurs in the ferroelectric preventing further displacement. When the voltage is decreased at point P'$_1$ before reaching the breakdown limit, cantilever displacement decreases, and it follows dashed curve 12 independently of which displacement path was followed on the immediately preceding (interrogation or read) voltage increase. At zero voltage the displacement returns to P'$_2$ and the starting remanant displacement ($d_r$) of the cantilever tip is maintained due to a remanant strain of the ferroelectric film. When the voltage is decreased to zero, the ferroelectric domains remain oriented in the direction of the previously applied maximum electric field causing part of the strain and correlated cantilever displacement to persist. Upon the return of the voltage to zero and the displacement to point P'$_2$, the data state has been erased because the positive (interrogation or read) voltage increase to point P'$_1$ causes the ferroelectric to always be repoled positive and the cantilever displacement will always follow curve 11 for subsequent positive voltage increases. This type of operation is referred to as a destructive read of the memory state. In order to rewrite the data state that uses displacement path 15, the voltage must be decreased to negative voltage point P'$_4$ and then returned to zero. For a negative interrogation voltage decrease, a similar bimodal displacement is observed as described for the positive voltage increase with the appropriate reversal of voltage polarities. In general, the persistence of ferroelectric polarization and the associated polarization induced strain at the zero voltage state provides the origin for non-volatile data storage in a ferroelectric-mechanical-memory device.

A variety of techniques could be used to determine the data state stored by the piezoelectric or ferroelectric displacement direction described above. One such technique is sensing by electrical conduction and cantilever device architectures that enable this sensing scheme.

Referring now to FIG. 4A, a preferred embodiment memory bit cell architecture 20 is shown. The ferroelectric capacitor 21 comprises conductive layers 22 and 24 positioned above and below a ferroelectric layer 23, which may be, for example, a piezoelectric layer. The ferroelectric capacitor may be positioned on a resilient or elastic layer 33. The ferroelectric capacitor and resilient layer 33 extend over a cavity 32 in base or substrate 31 to form a cantilever structure that is suspended above the base 31 (which may be, for example, a Si wafer). The conductive layer 24 upon upward bending of the resilient layer 33 connects to a contact pad or contact layer 34 that is located above the cantilever as shown in FIG. 4A. Without any voltage applied to the ferroelectric layer 23, the cantilever conductive layer 24 is not in contact with the contact layer or contact pad 34, and therefore, the cantilever switch is in the normally-open (NO) state. When a voltage is applied to the ferroelectric layer 23, the cantilever will either move up or down depending on the voltage applied during the write operation (or the poled state) of the ferroelectric layer and the direction of the applied voltage as described previously in FIG. 3.

The preferred embodiment 20 shown in FIG. 4A further comprises input/output contacts 25 and 37 which are connected to the conductive layers 22 and 24, respectively.

The ferroelectric layers used in the preferred embodiments shown in FIGS. 4A though 4E, 7A through 7D, 9A through 9D, 10A through 10D, 11A through 11C, 12A through 12C, and 13-17 can comprise, but are not limited to $PbZr_{0.52}Ti_{0.48}O_3$, $(1-x)PbMg_{1/3}Nb_{2/3}O_3$-$(x)PbTiO_3$, $BaTiO_3$, $KNaNbO_3$, $LiNbO_3$, $LiTaO_3$, doped (Mg, Y, Ca, Si, Hf etc) and undoped $ZrO_2$, doped and undoped (Mg, Y, Ca, Si, Zr etc.) $HfO_2$, $SrBi_2Ta_2O_9$, $SrBi_2Ti_2O_9$, $Bi_4Ti_3O_{12}$, $Pb_5Ge_3O_{11}$, lead meta-niobate, and polyvinylidene fluoride.

Since anti-ferroelectric materials exhibit similar strain versus electric field hysteresis behavior as that observed in ferroelectrics, the ferroelectric layer 23 described above could be replaced with an anti-ferroelectric, e.g. $PbZrO_3$. The anti-ferroelectric element will provide a similar data storage and displacement behavior.

By analogy, a ferroelectric-mechanical-memory type device could be produced by replacing the ferroelectric element with any type of ferroic material that exhibits non-volative strain states. For example, the ferroelectric could be replaced with a ferromagnetic material and the ferromagnetic material can be driven through its strain hysteresis by using an applied magnetic field. Another example would be to use a ferroelastic material like those in the NiTi shape memory alloy system and to drive the device with resistive heating to induce the strain hysteresis.

The ferroelectric capacitor 21 is positioned in association with a MEMS switch 30, comprising a contact layer 34, optional cover/insulator 35, and contact or input/output contact or terminal 36. The thin film capacitor 21 is used to open and close the MEMS switch 30 through the use of the piezoelectric and ferroelectric effect produced by applying voltage between contacts/terminals 25 and 37 connected to the conductive layers 22 and 24, respectively, of the ferroelectric capacitor 21. The ferroelectric capacitor 21 can also be switched between or written into two different non-volatile remanant polarization memory states by applying voltage between terminals 25 and 37. The different remanant polarization states induce correspondingly different piezoelectrically driven mechanical displacement directions of the cantilever subassembly positioned on resilient layer 33.

A "memory" of the piezoelectric displacement direction is maintained or stored by the ferroelectric material remanant polarization even when all voltage is removed from terminals 25, 37 and 36.

Figure 5B:
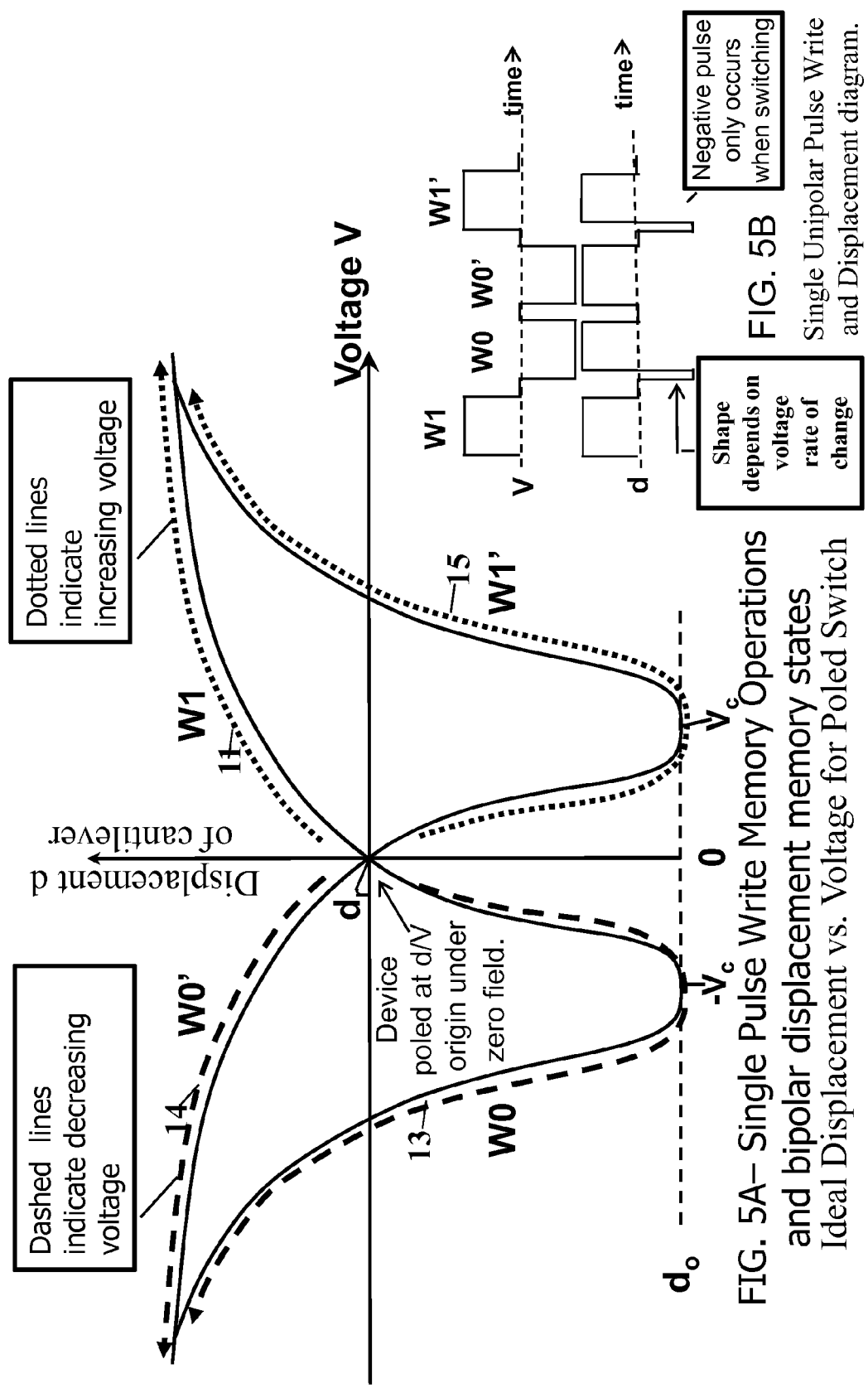
FIG. 5B is a diagram showing voltage and displacement versus time traces of the write operation sequence for the unipolar write memory operations and the bipolar memory states illustration of FIG. 5A.

The write operation of the preferred embodiment memory cell 20 is performed by application of a positive voltage (as illustrated in FIG. 5B, as W1) to contacts 25 and 37 which activates the ferroelectric capacitor 21, causing the resilient or elastic layer 33 to bend causing electrical contact between layers 24 and 34 for one of the memory states. For the writing of a second memory state, application of a negative voltage (as illustrated in FIG. 5B, as W0) to contacts 25 and 37 activates the ferroelectric capacitor 21, causing the resilient or elastic layer 33 to first bend in the opposite direction (for a voltage below Vc) and then bend in the same direction (for voltage greater than Vc) (as illustrated in FIG. 5B, as displacement d).

As to the reading of the preferred embodiment memory cell 20, subsequent to the write operations, the memory state of the preferred embodiment 20 (and in particular the ferroelectric capacitor 21) can be read by applying a voltage to terminals 25 and 37 (illustrated as a positive voltage R1 and R0 in FIG. 6B) creating a voltage across the ferroelectric layer 23 which causes either contact or no contact of the layer 24 with the contact layer 34 (illustrated in FIG. 6B as the displacement d) and simultaneously measuring the voltage differential between contacts 36 and 37; i.e., when the switch is closed the voltage differential is zero or substantially zero or substantially smaller than the voltage measured when the switch is open. The memory can also be read by measurement of the current flow through contacts 36 and 37; i.e., when the switch is closed (i.e., electrical contact between layers 24 and 34 occurs) there is a non-zero current flow when a voltage differential is applied across contacts 36 and 37, and for the reading of a "0" (as illustrated in FIG. 6B) there is no electrical contact between layers 24 and 34.

FIG. 4B is a schematic illustration of a top view of the preferred embodiment 20 of FIG. 4A.

FIG. 4C is a schematic illustration of a top view of an alternate preferred embodiment of the present invention comprising a dual-switch/dual-capacitor normally-open cell. A preferred embodiment 20DS, shown in FIG. 4C, comprises two thin film ferroelectric capacitors 21, 21A comprising conductive layers 22, 22A and 24, 24A having thin film ferroelectric layers 23, 23A therebetween, which may be, for example, lead zirconate titanate (PZT). Connected to the layers 22 and 24 are input/output contacts 25 and 37, respectively. Connected to the layers 22A and 24A are input/output contacts 25A and 37A, respectively. The ferroelectric capacitors 21, 21A are positioned on MEMS switches 30, 30A, and may be mounted on a common base 31. MEMS switches 30, 30A are further comprised of cavities 32, 32A, resilient layers 33, 33A, contact layers 34, 34A, optional covers/insulators 35, 35A, and contact or input/output contacts or terminals 36, 36A, respectively. During a read operation, the thin film capacitors 21, 21A are used to open and close the MEMS switches 30, 30A through the use of the piezoelectric effect produced by applying voltage between terminals 25, 37 and 25A, 37A. During a write operation, each ferroelectric capacitor 21, 21A can be switched between or written into two different non-volatile remanant polarization memory states by varying the voltages between contacts/terminals 25 and 37 relative to the voltages between contacts/terminals 25A and 37A. The different remanant polarization states stored during the write operation induces correspondingly different piezoelectrically driven mechanical displacement directions of the resilient layers 33, 33A for applied voltage magnitude below Vc during a subsequent read operation. The independent mechanical displacement directions for resilient layers 33, 33A are determined by both the applied voltage used to drive the piezoelectric displacement during a read operation and by the immediately preceding poling voltage of each ferroelectric capacitor applied during the write operation. When only a unipolar read pulse, e.g. positive, is used to read the stored data states of both MEMS switches 30, 30A, a total of four non-volatile memory states, determined by open and closed cantilever states during a read operation, can exist for the two switches. The four data states are as follows: (STATE 1) ferroelectric capacitor 21 and associated switch 30-positive write/positive read and ferroelectric capacitor 21A and associated switch 30A-positive write/positive read is data state 11, (STATE 2) ferroelectric capacitor 21 and associated switch 30-negative write/positive read and ferroelectric capacitors 21a and associated switch 30A-positive write/positive read is data state 10, (STATE 3) ferroelectric capacitor 21 and associated switch 30-positive write/positive read and ferroelectric capacitor 21A and associated switch 30A-negate write/positive read is data state 01, and (STATE 4) ferroelectric capacitor 21 and associated switch 30-negative write/positive read and ferroelectric capacitor 21A and associated switch 30A-negative write/positive read is data state 00. A "memory" of the piezoelectric displacement direction is maintained or stored by each ferroelectric capacitor's remanant polarization even when all voltage is removed from terminals 25, 37, 36 and 25A, 37A, 36A. During a read operation (for a voltage below Vc), after the writing of a positive voltage to contacts 25 and 37, a second "read" pulse is applied causing the ferroelectric capacitor 21 to be activated causing the resilient layer 33 to bend causing electrical contact between layers 24 and 34 for one of the memory states or bit, resulting in a "1" or "0" bit depending upon whether a positive or negative pulse was written. As an example of the second memory state or bit, during a read operation following the writing of a negative voltage to contacts 25 and 37, the application of the a read voltage (for a voltage below Vc) activates the ferroelectric capacitor 21, causing the resilient layer 33 to bend in the opposite direction and no electrical contact between layers 24 and 34 occurs resulting in the reading of zero bit. As a further example, with respect to the operation of the other capacitor 21A, during a read operation, application of a positive voltage to contacts 25A and 37A activates the ferroelectric capacitor 21A causing the resilient layer 33A to bend causing electrical contact between layers 24A and 34A for a third memory state, resulting in a "1." As an example of the fourth memory state, during a read operation, application of a voltage (for a voltage below Vc) to contacts 25A and 37A activates the ferroelectric capacitor 21A, causing the resilient layer 33A to bend in the opposite direction and no electrical contact between layers 24A and 34A occurs, resulting in the reading of a "0" bit. The memory state of the first ferroelectric capacitor can be read by apply voltage to terminals 25 and 37 which bends the resilient layer 33 and causes either contact or no contact of the layer 24 and 34 and simultaneously measuring the voltage differential between contacts 36 and 37; i.e., when the switch is closed the voltage differential is zero or substantially zero or substantially smaller than the voltage measured when the switch is open. The memory state of the second ferroelectric capacitor 21A can be read by apply voltage to terminals 25A and 37A which bends the resilient layer resilient layer 33A and causes either contact or no contact of the layer 24A and 34A and simultaneously measuring the voltage differential between contacts 36A and 37A; i.e., when the switch is closed the voltage differential is zero or substantially zero or substantially smaller than the voltage measured when the switch is open. The first part of the memory 20DS (including ferroelectric capacitor 21) can also be read by measurement of the current flow through contacts 36 and 37; i.e., when the switch is closed there is a non-zero current flow when a voltage differential is applied across contacts 36 and 37. The memory state of the second ferroelectric capacitor 21A can be read by apply voltage to terminals 25A and 37A which bends the resilient layer 33A and causes either contact or no contact of the layer 24A and 34A and simultaneously measuring the voltage differential between contacts 36A and 37A; i.e., when the switch is closed the voltage differential is zero or substantially zero or substantially smaller than the voltage measured when the switch is open. The memory can also be read by measurement of the current flow through contacts 36A and 37A; i.e., when the switch is closed there is a non-zero current flow when a voltage differential is applied across contacts 36A and 37A. It can be readily appreciated that although FIG. 4A is a side view of preferred embodiment 20, preferred embodiment 20DS is substantially similar when viewed from the side. The preferred embodiment 20DS is symmetrical and cutaway view along the middle of the device, showing the cross section positioned in the top half of FIG. 4C will be substantially identical.

The combination of the ferroelectric piezoelectric capacitor 21 and MEMS switch 30 provide a switch with a non-volatile memory having two different states produced by the piezoelectric induced mechanical displacement of the ferroelectric piezoelectric capacitor 21 integrated with the MEMS switch 30. The alternate preferred embodiment memory cell 20DS comprised of two ferroelectric capacitors 22, 22A and two switches 30, 30A acting in tandem provide a total of four memory states. The devices 20 and 40 can be used, for example, to make non-volatile memories, logic, relays and switch networks that do not require transistors. It can be readily appreciated by those of ordinary skill in the art that a plurality of devices like 20 and 20DS can be combined in parallel, series or an array to make non-volatile memories, logic, relays and switch networks that do not require transistors. Other commercial uses include non-volatile switching networks for wireless communications, reprogrammable robotics, and non-volatile memory for tunable resonators.

The method described herein for defining non-volatile memory states resulting from the displacement vs. voltage hysteresis loop utilizes the difference in the direction of motion of a cantilever driven with increasing and decreasing applied voltage between terminals 25 and 37 and the displacement is also dependent on the remanent polarization state of the ferroelectric capacitor. In FIG. 3, note that the direction of displacement, i.e., the derivative of the hysteresis curve at zero voltage, differs in sign when the device is cycled through either a positive or negative voltage applied across the ferroelectric 23. If desired, the origin of the hysteresis plot can be redefined by shifting the zero displacement state (or remanent displacement ($d_r$)). A minimum two-state memory device can then be defined. When either a positive or negative voltage is applied to the ferroelectric piezoelectric material after an initial poling, the displacement will be positive or negative (as long as the voltage does not exceed $V_c$) and it can therefore be used to read a positive and negative memory state stored by the remanent polarization in the ferroelectric capacitor.

FIG. 4D is a schematic illustration of a side view of an alternate preferred embodiment 20D of the present invention comprising a single switch with upper and lower contacts 34 and 34A, respectively. The switch/single capacitor forms a normally open memory cell in that the conductive layer 24 is spaced from the contact layer 34 when no voltage is present on the input contacts 25 and 37 (i.e., no voltage is present in conductive layers 22 and 24. The additional contact layers 34 and 34A may be connected to contacts/terminals 36, 36A.

The write operation of the preferred embodiment memory cell 20 is performed by application of a positive voltage (as illustrated in FIG. 5B, as W1) to contacts 25 and 37 which activates the ferroelectric capacitor 21, causing the resilient or elastic layer 33 to bend causing electrical contact between layers 24 and 34 for one of the memory states. For the writing of a second memory state, application of a negative voltage (as illustrated in FIG. 5B, as W0) to contacts 25 and 37 activates the ferroelectric capacitor 21, causing the resilient or elastic layer 33 to bend first in the opposite direction (for a voltage below Vc) and then bend in the same direction (for voltage greater than Vc) (as illustrated in FIG. 5B, as displacement d).

As to the reading of the alternate preferred embodiment memory cell 20D, subsequent to the write operations, the memory state of the preferred embodiment 20D (and in particular the ferroelectric capacitor 21) can be read by applying a voltage to terminals 25 and 37 (illustrated as a positive voltage R1 and R0 in FIG. 6B) creating a voltage across the ferroelectric layer 23 which causes either contact of the layer 24 with the contact layer 34 or contact between the conductive layer 24 and the contact layer 34A, and simultaneously measuring the voltage differential between contacts 36 and 37 or 36A and 37; i.e., when the switch is closed the voltage differential is zero or substantially zero or substantially smaller than the voltage measured when the switch is open. The memory can also be read by measurement of the current flow through contacts one of the contacts 36, 36A, and 37; i.e., when the switch is closed (i.e., electrical contact between layers 24 and 34 occurs) there is a non-zero current flow when a voltage differential is applied across contacts 36 and 37 (or 36A and 37), and for the reading of a "0" (as illustrated in FIG. 6B) there is electrical contact between layers 24 and 34A.

FIG. 4E is a schematic illustration of a top view of an alternate preferred embodiment 20D, which is described in the foregoing.

The voltages to be applied are dependent upon, inter alia, the thickness of the ferroelectric layer 23. The following example utilizes a thickness at approximately 0.5 μm PZT ferroelectric layer 23. Write voltage and read voltage are dependent on the ferroelectric material composition, thickness of the ferroelectric layer used in a device, the length of the cantilever and the required displacement for the cantilever to make contact. Therefore, the voltages are strongly dependent on the dimensions of the device and cannot be generalized. However, the following voltages may be appropriate for $PbZr_{0.5}Ti_{0.5}O_3$ with ferroelectric thickness of 0.5 μm. The example voltages given below are only valid for the specific ferroelectric composition and thickness given and should be viewed as approximate (plus or minus 50%) values. The voltages used using the ferroelectric material $PbZr_{0.5}Ti_{0.5}O_3$ with a ferroelectric thickness of 0.5 μm, coercive voltage Vc=5 V, write voltage=25 V, read voltage=4 V for low voltage read method of FIG. 6, and read voltage=25 V for high voltage read method of FIG. 8. The breakdown voltage is less than 50 V. The first voltage applied across the ferroelectric layer during the write operation is any voltage with magnitude greater than Vc and preferably about half of the breakdown voltage. For the cases included in the present application, the voltage is greater than Vc to store 1-state and less than −Vc to store the 0-state. The second voltage applied across the ferroelectric (between 24 and 34) during the read operation depends on the read method used. For the low voltage method shown in FIG. 6, the voltage is always between 0 and Vc. For PZT the Vc occurs at a voltage resulting in an electric field of about 50 kV/cm. For the ramped voltage method shown in FIG. 8, the voltage can be any voltage between 0 and the ferroelectric breakdown voltage, but it is preferred that the voltage be greater than Vc and less than the breakdown voltage. For PZT the voltage applied for the read operation should be a voltage resulting in an electric field between 50 kV/cm and 1 MV/cm, and most preferred around 200 kV/cm. Non-volatility allows for data to be stored between the write and read operations for times up to 10 years, but not limited to 10 years. As to the maximum voltages, using ferroelectric material $PbZr_{0.5}Ti_{0.5}O_3$ and a ferroelectric thickness=0.5 μm, the minimum write voltage=Vc=5 V. The maximum voltage or breakdown voltage=50 to 100 V. All voltages are approximate values and could vary by plus/minus 50%. As to the maximum and minimum read voltages, using the ferroelectric material composed of $PbZr_{0.5}Ti_{0.5}O_3$, with a thickness=0.5 μm, the minimum read voltage is approximately 0.5 V, and the maximum read voltage Vc=5 V. These voltages are approximate values and could vary by plus/minus 50%. As to the expression of the read and write voltage percentage using Ferroelectric material composed of $PbZr_{0.5}Ti_{0.5}O_3$ with a thickness of approximately 0.5 μm, the coercive voltage Vc=5 V, the write voltage=25 V, the read voltage=4 V for low voltage read method of FIG. 6, read voltage is 15 to 20% of the write voltage for this example. The read voltage is approximately 25 V for high voltage read method of FIG. 8, and the read voltage is equal to the write voltage for the FIG. 8 example. The breakdown voltage is less than 50 V.

Referring to FIGS. 5A and 5B, described therein is a voltage pulse sequence that defines how to write the 0 and 1 states of the FIG. 4A single-contact, normally-open (SCNO) preferred embodiment memory cell 20. It can be noted that this preferred embodiment memory cell 20 comprises a single-capacitor, single-resistor (1C1R) architecture where the capacitor is nonlinear, the resistor exhibits a delta function and no transistor is required within the cell. First, a 0-state and 1-state are defined as open and closed circuits, respectively, between terminals-37 and 36 (FIG. 4A). When a positive voltage pulse in excess of $V_c$ (preferably resulting in greater than 90% saturation of the ferroelectric domain switching) is applied to contact/terminal-37, and contact/terminal-25 and contact/terminal 36 are held at ground, the ferroelectric layer 23 and thus, the capacitor subassembly, is poled up (positive) and the cantilever subassembly (including resilient layer 33 and conductive layer 24) displaces upward (positive) resulting in the write of a 1-state, i.e. the direction of displacement (derivative dd/dV) will be positive for subsequent positive applied (read) voltage as shown in FIGS. 6A, 6B. Reversing the write pulse polarity on contact/terminal-37 such that a negative voltage is applied between contact/terminals 25 and 37 results in the write of a 0-state, i.e. the direction of displacement (derivative dd/dV) of the cantilever subassembly (including resilient layer 33 and conductive layer 24, ferroelectric layer 23 and conductive layer 22) will be negative for subsequent positive applied (read) voltage below $V_c$ as shown in FIGS. 6A, 6B. The voltage and displacement versus time traces are shown in of FIG. 5B for a series of 1 and 0 write operations. As shown in FIG. 5B W1 and W1' occur via paths 11 and 15 (increasing voltage), respectively of FIG. 5A. W0 and W0' occur via paths 13 and 14 (decreasing voltage). Note in FIG. 5B that negative displacement is shown for brief durations during the beginning of the W0 and W1', pulses and the shape of the negative displacement depends on the voltage ramp rate. It should be noted that the displacement versus voltage behavior is only valid for pulse lengths that are longer than the cantilever bending mode resonance frequency.

Referring now to FIGS. 6A and 6B, In order to read the 0 or 1 memory state, a unipolar positive voltage pulse that is below $V_c$ can be applied to contact/terminal 37 while contact/terminal 25 is held at ground to cause bending of the cantilever subassembly (including resilient layer 33 and conductive layer 24, ferroelectric layer 23 and conductive layer 22). Simultaneously a voltage differential is applied between contact/terminal 37 and contact 36 in order to produce no current flow when the switch is open, i.e., no contact between conductive layer 24 and contact layer 34, or a current flow when the switch is closed, the cantilever subassembly (including resilient layer 33 and conductive layer 24, ferroelectric layer 23 and conductive layer 22) moves upward and contact occurs between conductive layer 24 and contact layer 34. This read method will be called the low-voltage read method. FIG. 6B shows the case where a positive read voltage pulse is applied between contact/terminal 25 and contact 37 and the 1-state is read for positive displacement, i.e. the cantilever closes the switch gap, and a 0-state is read for negative cantilever displacement, i.e. the cantilever switch gap remains open. Applied input voltage and cantilever tip displacements for a read-1 and read-0 case are shown in FIG. 6B. Assuming that capacitor 41A (FIG. 7A) is pre-charged to ground (i.e, both plates of the capacitor are grounded) between each read operation, the sensed output voltage measured on capacitor 41A will be determined by the charge flow from terminal 37 to 36 during the time of switch closure for the 1-state and zero or substantially zero for a 0-state. The sensed current flow from contact/terminal 37 to contact/terminal 36 will be zero for a 0-state and non-zero for a 1-state. The data state stored in the preferred embodiment memory cell 20 can therefore be determined at contact/terminal 36 by using a sense amplifier 41 and charge integrating capacitor 41A (FIG. 7A) or any device that senses voltage differentials or current flows. Alternatively, if the piezoelectric drive voltage is properly scaled, the voltage at contact/terminal 36 could be routed directly to the memory output, thus eliminating the need for sense amplifiers 41 for the memory cell. The low-voltage read method can use pulse write and read operations, but it has the disadvantage that the read pulse is not executed at the same voltage as the write pulse. In addition, the read pulse is likely to disturb the stored data 0-state because the voltage applied to the ferroelectric capacitor between contacts/terminals 25 and 37 during the read operation could reverse some of the ferroelectric polarization; therefore, a data state rewrite operation following each read operation will be required in order to ensure data retention. Without a data state rewrite, the low voltage read operation will likely cause depoling of the 0-state over multiple reads and therefore could cause the cantilever subassembly (including resilient layer 33 and conductive layer 24, ferroelectric layer 23 and conductive layer 22) to not bend or displace in the downward direction resulting in an error in the read of the 0-state for some ferroelectric-mechanical-memory device designs. For some device alternate preferred embodiment designs, such a 0-state read error could be offset with a double cantilever alternate preferred embodiment 20DS (as shown in FIG. 4C) with the application of opposite or complementary poling of the two capacitors and read out of the differential between the two switches, i.e. use of two preferred embodiment memory cells 20 per memory bit. Otherwise the use of a rewrite operation is likely required for a single preferred embodiment memory cell 20 per memory bit architecture.

FIG. 7A is a schematic illustration of a sense amplifier 41 and a charge integrating sense capacitor 41A connected to the preferred embodiment 20 (shown schematically). The preferred embodiment 20 of FIG. 7A is identical to the preferred embodiment 20 of FIG. 4A except for the addition of the sense amplifier 41, capacitor 41A and reference voltage. Thus, the description of all of the elements of preferred embodiment 20 as well as the operation is herein incorporated by reference. Examples of sensor amplifiers are given in "Design of a Low Power Latch Based SRAM Sense Amplifier," by Sarah Brooks, www.wpi.edu/ . . . /Demonstration_of_SRA . . . Worcester Polytechnic Institute, Mar. 27, 2014, herein incorporated by reference.

In FIG. 7A, R1 and R0 show read operation for a "1" and "0" state single bit device, respectively, when the preferred embodiment 20 is activated by applying a voltage between contacts/terminals 25 and 37 and contact between conductive layer 24 and contact layer 34 is sensed by applying voltage between contacts 37 and 36 (the capacitor 41A is pre-charged to ground). FIG. 7B is a top view schematic illustration depicting a preferred embodiment 20 having a "cantilever drive" electrode 24 connected to terminal 37 that sources the read current or charge. It should be noted that FIG. 7B is configured as a three contact/terminal device having contacts/terminals 25, 36 and 37 similar to those shown in FIG. 4A. Consequently, the operation of the preferred embodiment 20 described with respect to FIG. 4A is the same as FIG. 7B and the components/elements are hereby incorporated herein by reference. FIG. 7C is a top view schematic illustration depicting a preferred embodiment 20A having a separate conductive layers 39A and 39B that sources the read current. Note that FIG. 7C is configured as a four terminal device having contacts/terminals 25, 37, 36A and 36B. The resilient layer 33, conductive layer 24, conductive layer 22, and ferroelectric layer 23 (positioned underneath conductive layer 22) are identical to the embodiment 20 of FIG. 4A. The alternate preferred embodiment 20A shown in FIG. 7C includes a conductive pad 24C in electrical contact with the conductive layer 24 positioned to complete the circuit between contacts 36A and 36B when the conductive layer is raised. The contacts 25 and 37 are identical. The contacts/terminals 36A and 36B are connected to the conductive layers 39A and 39B, respectively, that form a complete conductive layer when the cantilever subassembly (comprising the conductive layers 22, 24, ferroelectric layer 23 and resilient layer 33) is displaced upward and the conductive pad 24C makes contact with both conductive layer 39A and conductive layer 39B. One of the terminals 36A is connected to a voltage/current source and the remaining contact/terminal 36B is connected to the sense capacitor 41A, FIG. 7E, during the read operation. The 1-state and 0-state write operations for the four terminal alternate preferred embodiment 20A in FIG. 7C are the same as the 1-state and 0-state write operations described in conjunction with FIGS. 4A, 5A, 5B for the three terminal preferred embodiment 20 shown in FIG. 4A, and are herein incorporated by reference. The 1-state and 0-state read operation for the four terminal alternate preferred embodiment 20A differs from the three terminal preferred embodiment 20. During the read of the four terminal alternate preferred embodiment 20A shown in FIG. 7C, a unipolar positive voltage pulse that is below $V_c$ can be applied to contact/terminal 37 while contact/terminal 25 is held at ground to cause bending of the cantilever subassembly position above resilient layer 33. Simultaneously a voltage differential is applied between contacts/terminals 36A and 36B in order to produce no current flow when the switch is open and no contact occurs between conductive layer 39A, conductive pad 24C and conductive layer 39B, or a current flow when the switch is closed and contact occurs between conductive layer 39A, contact pad 24A and conductive layer 39B. This read method of the four terminal alternate preferred embodiment 20A follows the low-voltage read diagrams shown in FIGS. 6A and 6B. FIG. 6B shows the case where a positive read voltage pulse is applied between contact/terminal 25 and contact/terminal 37 and the 1-state is read for positive displacement, i.e. the cantilever subassembly positioned above resilient layer 33 closes the switch gap between conductive layers 24 and 34, and a 0-state is read for negative cantilever displacement, i.e. the cantilever switch gap remains open. Applied input voltage and cantilever tip displacements for a read-1 and read-0 case are shown in FIG. 6B. Assuming that capacitor 41A (FIG. 7E) is pre-charged to ground between each read operation, the sensed output voltage measured on capacitor 41A will be determined by the charge flow from terminal 36A to 36B during the time of switch closure for the 1-state and zero or substantially zero for a 0-state. The sensed current flow from contacts/terminal 36A to 36B will be zero for a 0-state and non-zero for a 1-state. The data state stored in the ferroelectric-mechanical-memory can therefore be determined at contact/terminal 36B by using a sense amplifier 41 and charge integrating capacitor 41A (FIG. 7E) or any device that senses voltage differentials or current flows. FIG. 7D is a schematic illustration of the alternate preferred embodiment shown in FIG. 7C, depicting the side view of the alternate preferred embodiment 20A having separate conductive layers 39A or 39B that sources the read current.

A second read method that can use read and write pulses of the same voltage magnitude greater than $V_c$ applied to the ferroelectric capacitor is described in FIGS. 8A and 8B and can be applied to either the three terminal device (FIGS. 4A and 4B) or the four terminal device (FIGS. 7C and 7D). If the voltage between contact/terminal 37 and contact/terminal 25 is increased to greater than $V_c$ and decreased at a controlled constant rate, the time that the conductive layer 24 contacts contact pad 34 (see FIGS. 4A and 7A) is closed, and the time of contact between conductive pad 24A and conductive layers 39A and 39B resulting in closure of contacts 36A and 36B shown in FIG. 7C, for a 0-state read will be smaller than the time for a 1-state read. For a three terminal device, applying a second voltage between contact 37 and contact 36 and integrating the charge passed from contact/terminal 37 to contact/terminal 36 during the read cycle, i.e. during the time that voltage is applied between contact/terminal 37 and contact/terminal 25, the sensed integrated charge flow from contact/terminal 37 to contact/terminal 36 will be lower for a 0-state than for a 1-state. The difference between the read 0-state and 1-state signal voltage by integrating the charge flow from contact/terminal 37 to contact/terminal 36 on a capacitor 41A (FIG. 7A) will be smaller for this ramped voltage pulsing method (FIG. 8) than with the low voltage read method described above (FIG. 6). For a four terminal device such as the alternate preferred embodiment 20A, applying a second voltage between contact/terminals 36A and 36B and integrating the charge passed from contact/terminal 36A to contact/terminal 36B during the read cycle, i.e. during the time that voltage is applied between contact/terminal 25 and contact/terminal 37, the sensed integrated charge flow from contact/terminal 36A to contact/terminal 36B will be lower for a 0-state than for a 1-state. The difference between the read 0-state and 1-state signal voltage by integrating the charge flow from contact/terminal 36A to 36B on a capacitor 41A (FIG. 7E) will be smaller for this ramped voltage pulsing method (FIG. 8) than with the low voltage read method described above (FIG. 6). It is likely that the ramped voltage pulsing read will make the ferroelectric capacitor less susceptible to long term degradation mechanisms such as fatigue. Since this unipolar ramped voltage pulse read is a destructive read of the memory state, a rewrite of the initial memory state is required subsequent to the read cycle. The rewrite of the initial memory state can be completed by using the pulses shown in FIG. 5B or by replacing the pulses in 5B with ramped voltage pulses like those used for the read operation depicted in FIG. 8B.

In FIG. 8, voltage applied between contact/terminal 25 and contact/terminal 37 of a three terminal preferred embodiment memory cell 20 (FIG. 4A) is ramped positive to execute a read and the ramp rate determines contact time between 24 and 34 for the "1" bit state. For the "0" bit state the contact time is smaller than the 1-state because the cantilever subassembly (comprising the conductive layers 22, 24, ferroelectric layer and resilient layer 33) first bends open and remains open until the voltage applied between contact/terminal 25 and contact/terminal 37 becomes sufficiently large to cause the cantilever subassembly (comprising the conductive layers 22, 24, ferroelectric layer and resilient layer 33) to bend upward and close the contact between conductive layer 24 and contact layer 34. In FIG. 8, voltage applied between contact/terminal 25 and contact/terminal 37 of a four terminal alternate preferred embodiment 20A (FIG. 7C) is ramped positive to execute a read and the ramp rate determines contact time between contact/terminal 36A, conductive layer 39A, conductive pad 24C, conductive layer 39B, and contact terminal 36B for the "1" bit state. For the "0" bit state the contact time is smaller than the 1-state because the cantilever subassembly (comprising the conductive layers 22, 24, ferroelectric layer and resilient layer 33) first bends open and remains open until the voltage applied between contact/terminals 25 and 37 becomes sufficiently large to cause the cantilever subassembly (comprising the conductive layers 22, 24, ferroelectric layer and resilient layer 33) to bend upward and close the contact between conductive layer 36A, conductive pad 24C and conductive layer 39B. With this technique, consideration of shunting methods may be desirable.

FIG. 9A illustrates the position of the conductive layer 24 relative to the contact layer 34 for the preferred embodiment 20 of FIG. 4A. In addition, the preferred embodiment 20 is shown connected to a sense amplifier 40. The preferred embodiment 20 is a normally-open (NO) embodiment (open when no voltage is applied across the ferroelectric capacitor) that uses a single-contact on one side of the preferred embodiment memory cell 20 for sensing switch closure. FIG. 9B is a schematic illustration of the alternate preferred embodiment 20D (also shown in FIG. 4D) which employs a dual-contact contact pads 34, 34A where the cantilever subassembly (comprising conductive layers 22, 24, ferroelectric layer 23 and resilient layer 33) makes electrical contact when the cantilever subassembly is displaced in both the positive and negative directions. One method of implementing this device type would be to expose the conductive layer 24 on the bottom side of the cantilever and also add an optional second conducting layer 34A in the bottom of the cavity 32 as shown in the schematic side view FIG. 4D and schematic top view FIG. 4E (relating to the preferred embodiment 20D) The new conducting layer 34A would also be connected to a separate terminal 36A such that the device would consist of four terminals. The new conducting layer 34A and terminal 36A would allow the sensing of a switch closure for both positive and negative cantilever displacement. In the illustration of FIG. 9B, the conducting layers 24, contact layers 34 and 34A and the upper and lower contacts/terminals 36, 36C and 37 are shown and it should be concluded that an electrical circuit or contact is completed when the cantilever subassembly (comprising the conductive layers 22, 24, ferroelectric layer 23 and resilient layer 33) in contact with either the upper or lower contact layers 34, 34A. The alternate preferred embodiment 20D illustrated by FIG. 9B is referred to as a normally-open, dual-contact device. A third alternate embodiment 20NC is shown by the simplified illustration in FIG. 4C where the embodiment 20NC (which is identical to the preferred embodiment 20 except for the positioning of the cantilever subassembly and conductive layer 24) is in the normally closed (NC) state (the conductive layer 24 and contact layer 34 are in contact when no voltage is applied across the ferroelectric capacitor) and the preferred embodiment 20NC uses a single-contact 36 on one side of the preferred embodiment 20NC for sensing switch closure. Another alternative embodiment 20D-NC is a variant of the normally-closed device as illustrated in FIG. 9D and it employs a dual-contact design identical to the preferred embodiment 20D except that the cantilever subassembly (conductive layers 22, 24, ferroelectric layer 23 and resilient layer 33) makes electrical contact through conductive layer 24 when the cantilever subassembly is displaced in both the positive and negative direction. In both FIGS. 9B and 9D, one or both (upper and lower) contact layers 34 and 34A can act as a charge source and can be used for read operations for detecting either a 0-state or 1-state. As to the operation of the embodiments shown in FIGS. 9A, 9B, 9C and 9D the bits "1" and "0" may be written by poling the ferroelectric capacitor positive or negative as described with regard to FIG. 5B. For all four embodiments the bits "1" and "0" may be read by applying positive or negative voltage across the ferroelectric capacitor subassembly to cause displacement of the cantilever subassembly (comprising conductive layers 22, 24, ferroelectric layer 23 and resilient layer 33). Reading the data state of the preferred embodiment 20 illustrated in 9A may be achieved by applying a positive ferroelectric capacitor voltage according to the read method described with regard to FIGS. 6A, 6B; closure of the switch determines that a "1" is stored in the memory bit and the switch remaining open signifies a "0" is stored in the memory bit. Reading the data state of the preferred embodiment 20D illustrated in 9B may be achieved by applying a positive ferroelectric capacitor voltage according to the read method described with regard to FIG. 6B; contact between the conducting line 24 and the top conducting pad 34, i.e., switch closure at the top, determines that a "1" is stored in the memory bit and the switch closure between 24 and 34A at the bottom contact signifies a "0" is stored in the memory bit. Reading the data state of the alternate preferred embodiment 20NC illustrated in 9C is achieved by applying a positive ferroelectric capacitor voltage according to the read method described with regard to FIG. 6B; opening of the normally-closed switch, no contact between conductive layer 24 and contact layer 34, determines that a "0" is stored in the memory bit and the switch remaining closed, contact between conductive layer 24 and contact layer 34 signifies a "1" is stored in the memory bit. Reading the data state of the alternate preferred embodiment 20D-NC (dual contact, normally closed) illustrated in 9D is achieved by applying a positive ferroelectric capacitor voltage according to the read method described with regard to FIG. 6B; contact between the cantilever conductive layer 24 and the top contact layer 34, i.e., switch closure at the top, determines that a "1" is stored in the memory bit and the switch closure changing to the bottom contact between conductive 24 and contact layer 34A signifies a "0" is stored in the memory bit. The read operation described with regard to FIG. 8 can also be used to determine the 1-state and 0-state stored in the memory for each of the preferred embodiments shown in FIGS. 9A, 9B, 9C and 9D. As described with regard to FIG. 8, contact time and the detected voltages on integrating sense capacitors 41A connected to the output terminals 36 and 36A is determined by the rate of voltage ramp applied to the ferroelectric capacitor during the read operation. As an alternative, the operations may be completed as above, except with reverse polarities applied to the ferroelectric capacitor resulting in reversed "0" and "1" memory states.

It should be noted that the direction of the cantilever subassembly displacement with respect to the applied ferroelectric capacitor voltage can be reversed by altering the neutral plane of zero-stress within the cantilever structure. This can be advantageous depending on whether there is an initial curvature of the cantilever post-processing and whether it is desired that the switch is in the open or closed state with an applied voltage that results in saturation of the ferroelectric capacitor.

FIG. 10A schematically illustrates a normally-closed single-contact switch, such as the preferred embodiment 20NC (normally closed) illustrated in FIG. 9C above. The embodiment 20NC shown in FIG. 10A is identical in every respect to the embodiment 20 shown in FIG. 4A except that the cantilever subassembly (comprising conductive layers 22, 24, ferroelectric layer 23, resilient layer 33) is configured in a normally closed configuration. Hence, the description of the elements of preferred embodiment 20 of FIG. 4A is herein incorporated by reference. FIG. 10A illustrates a generalized case comprising conductive layer 24 and contact layer 34 and contacts 36 and 37 in "open" and "closed" positions. As to the operation of the preferred embodiment 20NC shown schematically in FIG. 10A, bits "1" and "0" may be written by poling the ferroelectric capacitor positive or negative as described with regard to FIG. 5B. The read operation can be conducted by applying positive voltage to cause displacement as described with regard to FIG. 6 or FIG. 8. The contact between conductive layer 24 and contact layer 34 remains constant for bit "1" read and contact is broken for bit "0" read. FIG. 10B is a top view schematic illustration depicting a preferred embodiment 20NC having a "cantilever drive" electrode 24 that sources the read current when voltage is applied between contacts 25 and 37. FIG. 10C is a top view schematic illustration depicting preferred embodiment 20A-NC (split contacts, normally closed) having a separate conductive layers 39A and 39B that sources the read current. FIG. 10D-NC is a side view schematic illustration depicting preferred embodiment 20A-NC (split contacts, normally closed) having a separate conductive layers 39A and 39B that sources the read current.

Note that FIG. 10C depicting preferred embodiment 20A-NC (split contacts, normally closed) is configured as a four terminal embodiment having contacts/terminals 25, 36, 37, 39A and 39B. The terminals 36A and 36B are connected to the conductive layers 39A and 39B, respectively, that form a complete conductive layer when the cantilever is upward (in the normally closed position) and the conductive pad 24C makes contact with both conductive layers 39A and 39B. One of the contact/terminals 36A may be connected to a voltage/current source and the remaining contact/terminal 36B may be connected to a sense capacitor during the read operation.

FIG. 11A schematically illustrates generalized preferred embodiment 20D identical in every respect to the embodiment shown in FIG. 4D showing an additional sensing circuit comprising sensing amplifier 41 and sensing capacitors 41A and 41B. The alternate preferred embodiment 20D comprises conductive layer 24, contact layer 34 and contact layer 34A and contacts 36, 36A and 37 in open and closed positions representing a normally open dual contact switch. As to the operation of the preferred embodiment 20D shown schematically in FIG. 11A, bits "1" and "0" may be written by poling positive or negative as described with regard to FIG. 5B. Regarding the read operation, the reading is conducted by applying positive voltage to cause displacement as described with regard to FIG. 6 or FIG. 8. Contact on top (between conductive layer 24 and contact layer 34) and bottom (between conductive layer 24 and contact layer 34A) determines whether the bit is "1" or "0," respectively. The sense voltage on capacitor 41A will be the same for the read 1-state and the read 0-state as shown in FIGS. 6B and 8B. For the same read 1-state and read 0-state, high and low magnitude sense voltages shown in FIGS. 6B and 8B will be reversed for the sense capacitor 41B. FIG. 4D and FIG. 4E are schematic illustrations depicting a preferred embodiment design having a "cantilever drive" conductive layer 24 and conductive pad 24C.

FIG. 11B and FIG. 11C are schematic illustrations depicting preferred embodiment 20B having two separate contacts 36, 36A, upper conductive layer 39A and lower conductive layer, that source the read current. During the 1-state read, contact is made between conductive pad 24A, conductive layer 39A, and conductive layer 39B such that current flows between contacts/terminals 36A and 36B. During the 0-state read, contact is made between conductive pad 43, conductive layer 44A and conductive layer 44B such that current flows between contacts/terminals 45A and 45B. Although not shown in FIG. 11B, the conductive layers 44A and 44B are configured identical to and located directly below conductive layers 39A and 39B. Although not shown in FIG. 11B, the conductive pad 43 is configured identical to and located directly below conductive pad 24C. Note that embodiment of FIG. 11B and FIG. 11C is configured as a six terminal device.

FIG. 12A schematically illustrates preferred embodiment 20D-NC (dual contact, normally closed) comprising conductive layer 24 and contact layer 34 in open (no contact) and closed (contact) positions. Preferred embodiment 20D-NC is identical in every respect to the embodiment 20D shown in FIG. 4D except for the positioning of the cantilever subassembly (conductive layers 20, 24, ferroelectric layer 23 and resilient layer 24) prior to the application of any voltage (i.e., normally closed). The description of each element of preferred embodiment 20D is herein incorporated by reference. As to the operation of the preferred embodiment 20D-NC (dual contact, normally closed) shown schematically in FIG. 12A, bits "1" and "0" may be written by poling positive or negative as described with regard to FIG. 5B. Regarding the read operation, the reading is conducted by applying positive voltage to cause displacement as described with regard to FIG. 6 or FIG. 8. Contact on top (between conductive layer 24 and contact layer 34) or bottom (between conductive layer 24 and contact layer 34A) determines whether the bit remains constant for a "1" or makes contact with the bottom (between conductive layer 24 and contact layer 34A) for a "0." Contact is broken between conductive layer 24 and contact layer +34A or switched to bottom contact between conductive layer 24 and contact layer 34A for a "0" bit.

FIG. 12B is a schematic top view illustration depicting a preferred embodiment 20B-NC design having two separate read lines that source the read current. The elements that form the preferred embodiment 20B-NC are identical to the elements that form the preferred embodiment 20B, except that the cantilever subassembly (conductive layers 20, 24, ferroelectric layer 23 and resilient layer 33 are mechanically strained biased in the closed position when there is no voltage. The description of the elements of preferred embodiment 20B is herein incorporated by reference. FIG. 12C is a schematic side view illustration depicting a preferred embodiment 20B-NC having separated read conductive layers 39A, 39B (upper) and 44A, 44B (lower) that source the read current. During the 1-state read, contact is made between conductive pad 24C, 39A, and 39B such that current flows between terminals 36A and 36B. During the 0-state read, contact is made between conductive pad 43, separated conductive layers 44A and 44B such that current flows between contacts/terminals 45A and 45B. Note that FIG. 12B and FIG. 12C is configured as a six terminal device.

FIGS. 13-15 illustrate alternate preferred embodiments. An extension of the invention can be to use diaphragms or an actuated stack for the MEMS structure, as shown in FIGS. 13 and 14, instead of the use of cantilevers. Shown in FIG. 13 is an alternate preferred embodiment 50 having a base or substrate 51 with a cavity 52. Positioned within the cavity 52 is an electrode layer 53 connected to a terminal contact 60. Ferroelectric capacitor 54 comprises conductors 55 and 57 with a ferroelectric layer 56 positioned therebetween. External contacts/terminals 58, 59 and 60 are connected to conductors 55, 57 and 53, respectively. As to the operation of the device shown schematically in FIG. 13, bits "1" and "0" may be written by poling positive or negative by applying voltage between terminals 58 and 59 as described with regard to FIG. 5B. For the device in FIG. 13, the neutral plane of the diaphragm is produced such that the diaphragm bends downward (driven by ferroelectric capacitor 54) when positive voltage is applied to terminal 58 and 59 is at ground. The read operation can be conducted by applying positive voltage between 58 and 59 to cause displacement as described with regard to FIG. 6 or FIG. 8. During the 1-state read, contact is made between 57 and 53 such that current flows between terminals 58 and 60. During the 0-state read, no contact is made between 57 and 53 such that no current flows between terminals 58 and 60.

Shown in FIG. 14 is an alternate preferred embodiment 70 having a base 71 with a cavity 72. Positioned within the cavity 72 is a ferroelectric capacitor 73 comprising conductors 74 and 76 with a ferroelectric layer 75 positioned therebetween. Conductor 77 extends above the ferroelectric capacitor in a normally open position; i.e. no contact between conductors 76 and 77. External terminals 78, 79 and 80 are connected to conductors 74, 76 and 77, respectively. As to the operation of the device shown schematically in FIG. 14, bits "1" and "0" may be written by poling positive or negative by applying voltage between terminals 78 and 79 as described with regard to FIG. 5B with the exception that voltage polarity is reversed for writing a 1-state and a 0-state, i.e. a 1-state is written with a positive voltage applied to the top electrode 76 and 74 is connect to ground and the 0-state is written with a negative voltage applied to 76 while 74 is connected to ground. The read operation can be conducted by applying positive voltage between 78 and 79 to cause displacement, thickness expansion of the ferroelectric 75 as described with regard to FIG. 6 or FIG. 8. During the 1-state read the ferroelectric layer 75 expands in thickness and contact is made between 76 and 77 such that current flows between terminals 79 and 80. During the 0-state read, the ferroelectric layer 75 contracts in thickness and no contact is made between 76 and 77 such that no current flows between terminals 79 and 80. Note that FIG. 14 is configured as a three terminal device.

Shown in FIG. 15 is an alternate preferred embodiment 90 having a base 91 with a cavity 92. Positioned within the cavity 92 is a ferroelectric capacitor 93 comprising conductors 94 and 98 with a ferroelectric layer 95 positioned therebetween. Conductor 96 is a strain sensitive conductor in contact with insulating layer 98A which covers conductor 98. Conductor 97A and 97B are on top of strain sensitive conductor 96 and conductors 97A and 97B are separated and covered by an electrically insulating layer 99. External contacts/terminals 100, 101, 102, and 103 are connected to conductors 98, 94, 97B and 97A, respectively. When the device is not activated and no voltage is applied to the terminals, the strain sensitive conductor is 96 is in an insulating or low conductivity state and the conductivity between conductors 97B and 97A is low. When voltage is applied to the ferroelectric capacitor 93 such that the thickness of the ferroelectric layer expands, strain sensitive conductor 96 is compressed and the conductivity increases allowing substantial conduction between conductors 97B and 97A. As to the operation of the device shown schematically in FIG. 15, bits "1" and "0" may be written by poling positive or negative by applying voltage between terminals 100 and 101 as described with regard to FIG. 5B. The read operation can be conducted by applying positive voltage between terminals 100 and 101 to cause displacement, thickness expansion of the ferroelectric 95 as described with regard to FIG. 6 or FIG. 8. During the 1-state read the ferroelectric layer 95 expands in thickness and conduction is increased in 96 allowing substantial current flow between 97A and 97B such that current flows between terminals 102 and 103. During the 0-state read, the ferroelectric layer 95 contracts in thickness, layer 96 remains in a low conductivity or insulating state and only a low current can flow between 97A and 97B such that only a low current flows between terminals 102 and 103. Note that FIG. 15 is configured as a four terminal device.

A preferred embodiment 70A (three terminal device) that incorporates a strain sensitive conduction layer 96 is shown in FIG. 16. The device write and read operation is the same as that described for the device shown in FIG. 14. The like number elements of preferred embodiment 70A refer to the same numbered components of preferred embodiment 70. Preferred embodiment 70A adds a strain sensitive conductor 96.

A design for a four terminal preferred embodiment 90A that incorporates an actuator stack positioned in a cavity is shown in FIG. 17. The device write and read operation is the same as that described for the preferred embodiment 90 shown in FIG. 15. The like number elements of preferred embodiment 90A refer to the same numbered components of preferred embodiment 90. Preferred embodiment 90A does not have a strain sensitive conductor 96 or insulating layer 98A. Instead the conductor 98 completes the circuit between elements 97A and 97B upon activation of the ferroelectric capacitor 93.

In MEMS memory cells, the opening between the contacts can be replaced with a material that exhibits a change in electrical conductivity with strain. When the ferroelectric is driven through the strain hysteresis, the strain sensitive conducting material will change its level of conductivity and the non-volatile strain states of the ferroelectric will provide non-volatile conductivity states in the conductor. This will allow the occurrence of non-volatile on and off states for the memory cell. The strain sensitive conductor could be a Mott-metal, piezo-resistive material, conducting polymer, conducting liquid, etc.

The scope of the present invention encompasses many types of configuration, cell architectures and read/write operation modes for the ferroelectric-mechanical-memory. It should be considered that the scope of the invention covers all these possibilities since the basic concept of using a cantilever or other type of MEMS devices in combination with the mechanical displacement of a switchable ferroelectric capacitor is central to all variations of the device that is used for a memory bit storage device. Some of the varieties of devices that incorporate a cantilever in the normally-open and normally-closed states as well as the use of single and dual contact switches are shown schematically in the foregoing. The bit cells can be arranged in an array like those commonly found in integrated circuit memory devices including driver circuits, input/output, MUX/DEMUX, redundancy, error correction and any other circuit blocks used in state-of-the art memory devices. Since the ferroelectric-mechanical-memory bit cell is non-volatile, it does not use a transistor and it can be used to make transistor-free non-volatile logic devices. The present invention comprises memory and non-volatile logic blocks on the same chip by using the similar basic ferroelectric-mechanical-memory cells described in the foregoing.

As used herein, the term "nonvolatile" means that the memory cell will retain data even if there is a break in the power supply.

Obviously, many modifications and variations of the present invention are possible in light of the above teachings. It is therefore to be understood that, within the scope of the appended claims, the invention many be practiced otherwise than as specifically described.

What is claimed is:

1. A method of making a nonvolatile memory cell comprising;
    forming a ferroelectric layer;
    forming a ferroelectric capacitor by positioning the ferroelectric layer between conductive layers;
    the conductive layers adapted to be connected to a voltage source;
    securing one end of the ferroelectric capacitor while allowing the ferroelectric capacitor to flex into first and second positions; the ferroelectric capacitor flexing into the second position upon application of a voltage from the voltage source;
    providing a first contact, the capacitor being in operative electrical connection with the first contact in the second position;
    providing a sense amplifier operatively connected to the first contact to sense the opening and closing of the operative connection to the first contact such that during a read operation the sense amplifier is used to detect the amount of time the contact is in operative electrical connection with the voltage source;
    the voltage source operative to apply a positive or negative voltage to the ferroelectric capacitor causing the ferroelectric layers to deform internally and resulting in different internal deformation of the ferroelectric material depending upon whether a positive or negative voltage is applied that is retained after the voltage is removed, and wherein the deformation can be used to store either a one or zero binary bit, and wherein a subsequent voltage across the ferroelectric capacitor operates to determine whether a one or zero has been stored based upon operative electrical contact between the first contact and the ferroelectric capacitor.

2. The method of claim 1 further comprising;
    providing a base; wherein the ferroelectric capacitor forms part of a cantilever subassembly wherein a first portion of the cantilever subassembly is secured to the base and the second portion moves from the first position to the second position, the ferroelectric capacitor flexing in the second position to allow operative electrical connection to the first contact to provide a reading of memory.

3. A method of making a nonvolatile memory device comprising:
    providing two electrically conductive layers adapted to be connected to a voltage source;
    providing a first ferroelectric layer positioned between the two conductive layers; the ferroelectric layer comprising a fixed portion and a movable portion; the movable portion being displaced a predetermined distance from a first position to a second position upon application of a positive or negative voltage between the two conductive layers;
    providing a first contact operatively connectable to one of the two conductive layers and to one of a voltage potential or ground;
    providing a sense amplifier operatively connected to the first contact to sense the opening and closing of the operative connection to the first contact such that during a read operation the sense amplifier is used to detect the amount of time the contact is in operative electrical connection with the voltage source;
    the application of one of a positive or negative voltage from the voltage source resulting in the first ferroelectric layer deforming internally and resulting in different internal deformation of the ferroelectric material when a positive voltage is applied than the internal deformation when a negative voltage is applied and the internal deformation is retained after the voltage is removed, and
    causing movement of the movable portion from the first to the second position resulting in operative electrical connection between one of the two conductive layers and the contact; the ferroelectric layer being configured to retain a first state if a positive voltage is applied and a second state if a negative voltage is applied;
    whereby the internal deformation is due to hysteretic dimensional changes and can be used to store either a one or zero binary bit that is retained when no voltage is applied, and wherein a subsequent voltage across the ferroelectric capacitor operates to determine whether a one or zero has been stored.

4. The method of claim 3 wherein the application of a positive charge from the voltage source causes a first state of deformation within the ferroelectric layer and the application of a negative charge causes a second state of deformation within the ferroelectric layer; and wherein a subsequent application of a voltage across the one of the two conductive layers and the contact operates to determine whether the ferroelectric layer is in the first or second states.

5. The method of claim 3 further comprising providing a second ferroelectric layer positioned between two second conductive layers; the second ferroelectric layer comprising a fixed portion and a movable portion; the movable portion being displaced a predetermined distance from a first position to a second position upon application of a positive or negative voltage between the two second conductive layers; a second contact operatively connectable to one of the two conductive layers and to one of a voltage potential or ground; the application of one of a positive or negative voltage from the voltage source causing movement of the movable portion from the first to the second position resulting in operative electrical connection between one of the two second conductive layers and the second contact; the second ferroelectric layer being configured to retain a first state if a positive voltage is applied and a second state if a negative voltage is applied; whereupon the memory device has four possible states, the first and second states of the first ferroelectric layer and the first and second states of the second ferroelectric layer.

6. The method of claim 3 wherein the first and second ferroelectric layers comprises one or more of $PbZr_{0.52}Ti_{0.48}O_3$, $(1-x)PbMg_{1/3}Nb_2/3O_3-(x)PbTiO_3$, $BaTiO_3$, $KNaNbO_3$, $LiNbO_3$, $LiTaO_3$, doped (Mg, Y, Ca, Si, Hf) $ZrO_2$, undoped $ZrO_2$, doped (Mg, Y, Ca, Si) $HfO_2$, undoped $HfO_2$, $SrBi_2Ta2O_9$, $SrBi_2Ti_2O_9$, $Bi_4Ti_3O_{12}$, $Pb_5Ge_3O_{11}$, lead meta-niobate, and polyvinylidene fluoride.

7. A method of making a nonvolatile memory device comprising:
providing a base;
providing two electrically conductive layers adapted to be connected to a voltage source;
providing a ferroelectric layer positioned between the two conductive layers; the ferroelectric layer comprising a fixed portion operatively connected to the base and a movable portion; the movable portion being displaced a predetermined distance from a first position to a second position upon application of a positive or negative voltage between the two conductive layers;
providing a first contact operatively connectable to one of the two conductive layers;
providing a sense amplifier operatively connected to the first contact to sense the opening and closing of the operative connection to the first contact such that during a read operation the sense amplifier is used to detect the amount of time the contact is in operative electrical connection with the voltage source;
the application of one of a positive or negative voltage from the voltage source causing movement of the movable portion from the first to the second position resulting in operative electrical connection between one of the two conductive layers and the contact; the ferroelectric layer being configured to retain a first state of deformation if a positive voltage is applied and a second state of deformation if a negative voltage is applied and the state of deformation is retained after the voltage is removed.

8. The method of claim 7 wherein the application of a positive charge from the voltage source causes a first state of deformation within the ferroelectric layer and the application of a negative charge causes a second state of deformation within the ferroelectric layer; and wherein a subsequent application of a voltage across the one of the two conductive layers and the contact operates to determine whether the ferroelectric layer is in the first or second state.

9. The method of claim 7 wherein the application of a positive or negative voltage to the two conductive layers results in different internal deformation of the ferroelectric layer, and wherein the deformation can be used to store either a one or zero binary bit, and wherein a subsequent voltage across the memory cell operates to determine whether a one or zero has been stored.

10. The method of claim 7 wherein the application of a positive or negative voltage to the two conductive layers results in deformation of the ferroelectric layer into one of first and second states that can be used to store either a one or zero binary bit, and wherein a subsequent voltage across the memory cell operates to determine whether a one or zero has been stored.

11. The method of claim 7 wherein once the ferroelectric layer is configured into one of the first or second states, upon application of a subsequent voltage, the opening and closing of the operative connection to the first contact by the displacement of the ferroelectric layer operates as a read operation of the nonvolatile memory device.

12. The method of claim 7 further comprising providing a sensor operatively connected to the first contact to sense the opening and closing of the operative connection to the contact.

13. The method of claim 7 wherein the two conductive layers and ferroelectric layer form a capacitor, each of the two conductive layers adapted to be connected to a voltage source; and wherein the movement of the movable portion of the ferroelectric layer causes the capacitor to become operatively connected to the contact causing deformation of the ferroelectric layer.

14. The method of claim 7 wherein the two conductive layers and ferroelectric layer form a capacitor; and wherein application of a voltage to the capacitor causes the ferroelectric layer to deform due to hysteretic dimensional changes.

15. The method of claim 7 wherein the two conductive layers and ferroelectric layer form a capacitor; and further comprising providing a cantilever and wherein the capacitor is operatively associated with the cantilever and wherein the cantilever operatively connects to the first contact and continues to be operatively connected with the first contact as long as voltage is applied to the ferroelectric capacitor to provide a reading of memory.

16. The method of claim 7 wherein the ferroelectric layer comprises one of $PbZr_{0.52}Ti_{0.48}O_3$, $(1-x)PbMg_{1/3}Nb_2/3O_3-(x)PbTiO_3$, $BaTiO_3$, $KNaNbO_3$, $LiNbO_3$, $LiTaO_3$, doped (Mg, Y, Ca, Si, Hf) $ZrO_2$, undoped $ZrO_2$, doped (Mg, Y, Ca, Si) $HfO_2$, undoped $HfO_2$, $SrBi_2Ta2O_9$, $SrBi_2Ti_2O_9$, $Bi_4Ti_3O_{12}$, $Pb_5Ge_3O_{11}$, lead meta-niobate, and polyvinylidene fluoride.

17. The method of claim 1 wherein during operation positive or negative voltages are applied to the ferroelectric layer which retains a first state if a positive voltage is applied and a second state if a negative voltage is applied; and wherein the voltage source is 0.5 to 1 MV/cm, and wherein the voltage applied to the ferroelectric layer is reversed before reaching the breakdown limit.

* * * * *